US009722301B2

(12) United States Patent
Kim et al.

(10) Patent No.: US 9,722,301 B2
(45) Date of Patent: Aug. 1, 2017

(54) ANTENNA DEVICE AND ELECTRONIC DEVICE INCLUDING THE SAME

(71) Applicant: SAMSUNG ELECTRONICS CO., LTD., Suwon-si, Gyeonggi-do (KR)

(72) Inventors: Kyung Bin Kim, Hwaseong-si (KR); Jinu Kim, Seoul (KR); Byeonghwan Youm, Suwon-si (KR); Gi-Uk Gang, Suwon-si (KR); Nak-Chung Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/256,926

(22) Filed: Sep. 6, 2016

(65) Prior Publication Data
US 2017/0133748 A1    May 11, 2017

(30) Foreign Application Priority Data
Nov. 6, 2015    (KR) .................. 10-2015-0155861

(51) Int. Cl.
*H05K 5/02* (2006.01)
*H01Q 1/24* (2006.01)
(Continued)

(52) U.S. Cl.
CPC ............. *H01Q 1/243* (2013.01); *H05K 5/006* (2013.01); *H05K 5/0017* (2013.01);
(Continued)

(58) Field of Classification Search
CPC .. H05K 5/2017; H05K 5/0239; H05K 5/0243; H05K 5/0247
See application file for complete search history.

(56) References Cited

U.S. PATENT DOCUMENTS

| 5,283,104 | A  | 2/1994  | Aoude et al. |
| 6,458,670 | B2 | 10/2002 | Nagasaka     |

*Primary Examiner* — Jeremy C Norris
(74) *Attorney, Agent, or Firm* — Nixon & Vanderhye, P.C.

(57) ABSTRACT

Various embodiments of the present disclosure may provide an electronic device that includes: a first cover configured to form a first surface of the electronic device; a second cover configured to form a second surface of the electronic device, the second cover being opposite to the first surface; a conductive sidewall configured to surround at least a part of a space formed between the first cover and the second cover; a conductive member located in the space and configured to integrally extend from the conductive sidewall, the conductive member including a first surface directed toward the first cover and a second surface directed toward the second cover; a non-conductive member located in the space to make contact with the conductive member, the non-conductive member including a first surface directed toward the first cover and a second surface directed toward the second cover; a conductive pattern disposed on the second surface of the non-conductive member and electrically connected to the conductive member; and a conductive structure disposed between the conductive pattern and the conductive member to electrically connect the conductive pattern to the conductive member. The non-conductive member may include a via hole that at least partially passes through the area between the first surface and the second surface thereof, and the conductive structure may include a first part having a first cross-sectional area and a second part having a second cross-sectional area that is larger than the first cross-sectional area, wherein at least a part of the conductive structure may be disposed within a through-hole of the non-conductive member, and the second part may be disposed closer to the second surface of the non-conductive member than the first part. Various other embodiments are possible.

20 Claims, 24 Drawing Sheets

(51) Int. Cl.
*H05K 5/03* (2006.01)
*H05K 5/00* (2006.01)
(52) U.S. Cl.
CPC ......... *H05K 5/0217* (2013.01); *H05K 5/0247* (2013.01); *H05K 5/03* (2013.01)

ANTENNA DEVICE AND ELECTRONIC DEVICE INCLUDING THE SAME

CROSS-REFERENCE TO RELATED APPLICATION

This application is based on and claims priority under 35 U.S.C. §119 to Korean Application Serial No. 10-2015-0155861, which was filed in the Korean Intellectual Property Office on Nov. 6, 2015, the entire content of which is incorporated by reference herein in its entirety.

TECHNICAL FIELD

Various example embodiments of the present disclosure relate to an electronic device, and for example, to an electronic device that includes an antenna device.

BACKGROUND

With the development of electronic communication technologies, electronic devices having various functions have been widely used. These electronic devices may have a convergence function for complexly performing one or more functions.

An electronic device may include an antenna for communication. When the antenna supports various frequency bands, a plurality of antennas or a complex form of antenna may be disposed in the electronic device.

SUMMARY

Various example embodiments may provide an antenna device and an electronic device that includes the same.

Various example embodiments may provide an antenna device and an electronic device that includes the same, the antenna device being configured to reduce and/or prevent the performance of an antenna radiator, which is formed on the boundary between heterogeneous materials, from being degraded by an external impact.

Various example embodiments may provide an electronic device that includes: a first cover configured to form a first surface of the electronic device; a second cover configured to form a second surface of the electronic device, the second cover being opposite to the first surface; a conductive sidewall configured to surround or border at least a part of a space formed between the first cover and the second cover; a conductive member disposed in the space and configured to integrally extend from the conductive sidewall, the conductive member including a first surface directed toward the first cover and a second surface directed toward the second cover; a non-conductive member disposed in the space to make contact with the conductive member, the non-conductive member including a first surface directed toward the first cover and a second surface directed toward the second cover; a conductive pattern disposed on the second surface of the non-conductive member and electrically connected to the conductive member; and a conductive structure disposed between the conductive pattern and the conductive member to electrically connect the conductive pattern to the conductive member. The non-conductive member may include a via hole that at least partially passes through the area between the first surface and the second surface thereof, and the conductive structure may include a first part having a first cross-sectional area and a second part having a second cross-sectional area that is larger than the first cross-sectional area, wherein at least a part of the conductive structure may be disposed within a through-hole of the non-conductive member, and the second part may be disposed closer to the second surface of the non-conductive member than the first part.

BRIEF DESCRIPTION OF THE DRAWINGS

The above and other aspects, features, and advantages of the present disclosure will be more apparent from the following detailed description, taken in conjunction with the accompanying drawings, in which like reference numerals refer to like elements, and wherein.

DETAILED DESCRIPTION

Figure 1:
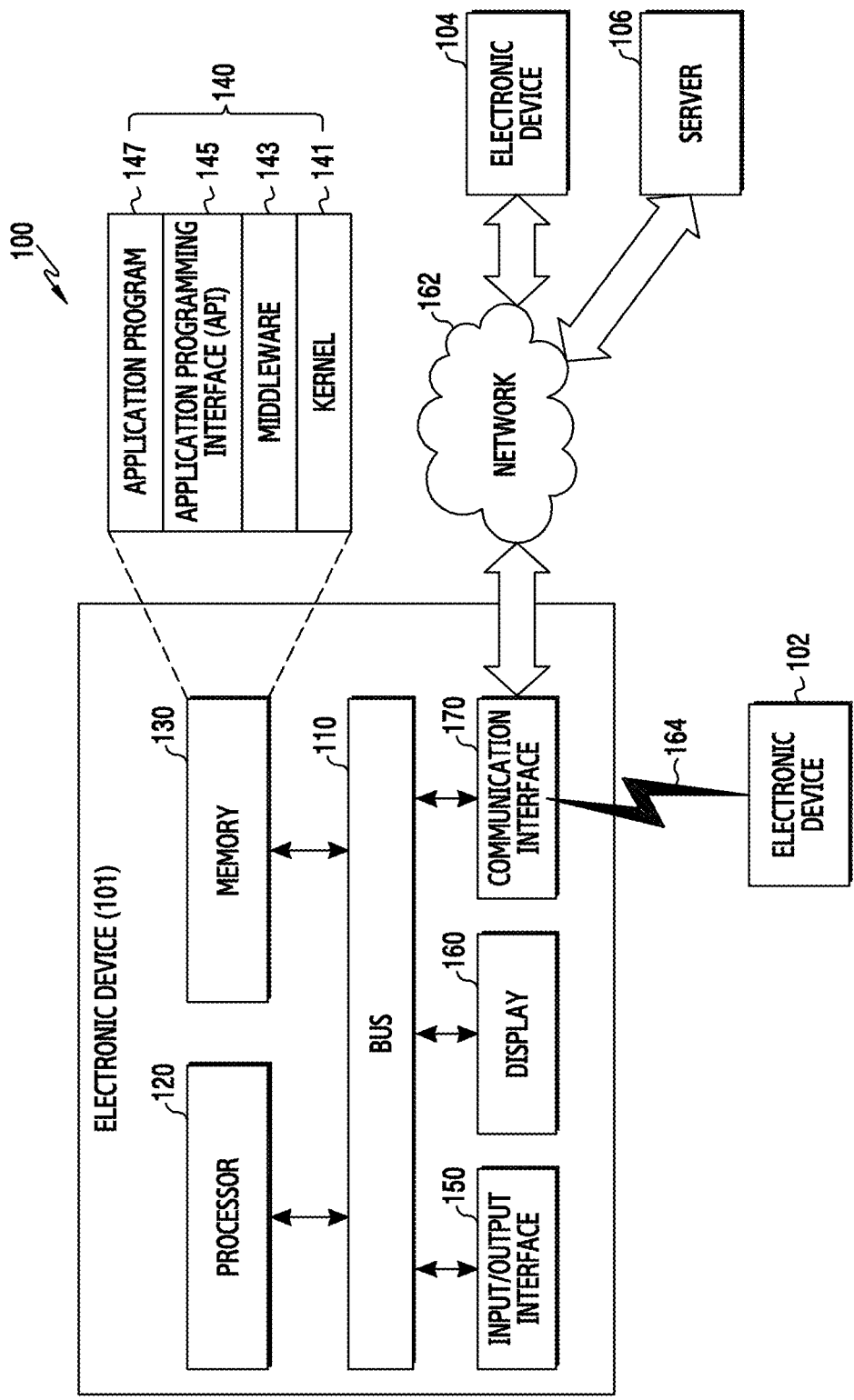
FIG. 1 is a diagram illustrating an example network environment that includes an electronic device according to various example embodiments of the present disclosure.

FIGS. 1 through 13, discussed below, and the various example embodiments used to describe the principles of the present disclosure in this description are provided by way of illustration only and should not be construed in any way to limit the scope of the disclosure. Those skilled in the art will understand that the principles of the present disclosure may be implemented in any suitably arranged electronic device. The following description with reference to the accompanying drawings is provided to assist in a comprehensive understanding of certain example embodiments of the present disclosure. It includes various example details to assist in that understanding but these are to be regarded merely as examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to their dictionary meanings, but, are merely used to enable a clear and consistent understanding of the present disclosure. Accordingly, it should be apparent to those skilled in the art that the following description of various embodiments of the present disclosure is provided for illustrative purposes only and not for the purpose of limiting the present disclosure as defined by the appended claims and their equivalents.

It is to be understood that the singular forms "a," "an," and "the" include plural references unless the context clearly dictates otherwise. Thus, for example, reference to "a component surface" includes reference to one or more of such surfaces.

The term "substantially" may, for example, refer to the situation in which the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The terms "include" and "may include" used herein are intended to indicate the presence of a corresponding function, operation, or constitutional element disclosed herein, and are not intended to limit the presence of one or more functions, operations, or constitutional elements. In addition, the terms "include" and "have" are intended to indicate that characteristics, numbers, operations, constitutional elements, and elements disclosed in the specification or combinations thereof exist. However, additional possibilities of one or more other characteristics, numbers, operations, constitutional elements, elements or combinations thereof may exist.

As used herein, the expression "or" includes any and all combinations of words enumerated together. For example, "A or B" may include either A or B or may include both A and B.

Although expressions used in various embodiments of the present disclosure, such as "1st", "2nd", "first", "second" may be used to express various constituent elements of the various embodiments of the present disclosure, these expressions are not intended to limit the corresponding constituent elements. For example, the above expressions are not intended to limit an order or an importance of the corresponding constituent elements. The above expressions may be used to distinguish one constituent element from another constituent element. For example, a first user device and the second user device are both user devices, and indicate different user devices. For example, a first constituent element may be referred to as a second constituent element, and similarly, the second constituent element may be referred to as the first constituent element without departing from the scope of the present disclosure.

When an element is mentioned as being "connected" to or "accessing" another element, this may mean that it is directly connected to or accessing the other element, or there may be intervening elements present between the two elements. On the other hand, when an element is mentioned as being "directly connected" to or "directly accessing" another element, it is to be understood that there are no intervening elements present.

The term "module" as used herein may imply a unit including one of hardware, software, and firmware, or a combination thereof. The term "module" may be interchangeably used with terms, such as unit, logic, logical block, component, circuit, and the like. A module as described herein may be a minimum unit of an integrally constituted component or may be a part thereof. The module may be a minimum unit for performing one or more functions or may be a part thereof. The module may be mechanically or electrically implemented. For example, the module as described herein includes at least one of hardware, a processor (e.g., including a CPU), an application-specific IC (ASIC) chip, a field-programmable gate arrays (FPGAs), and a programmable-logic device, which are known or will be developed and which may perform certain operations.

Unless otherwise defined, all terms, including technical and scientific terms, used herein have the same meaning as commonly understood by those of ordinary skill in the art to which various embodiments of the present disclosure belong. It will be further understood that terms, such as those defined in commonly used dictionaries, should be interpreted as having meanings that are consistent with their meaning in the context of the relevant art and the various embodiments of the present disclosure, and should not be interpreted in an idealized or overly formal sense unless expressly so defined herein.

An electronic device as used herein may be a device including, but not limited to, an antenna capable of performing a communication function in at least one frequency band. For example, the electronic device may be a smart phone, a tablet personal computer (PC), a mobile phone, a video phone, an e-book reader, a desktop PC, a laptop PC, a netbook computer, a personal digital assistant (PDA), a portable multimedia player (PMP), a moving picture experts group phase 1 or phase 2 (MPEG-1 or MPEG-2) audio layer 3 (MP3) player, a mobile medical device, a camera, and a wearable device (e.g., a head-mounted-device (HMD), such as electronic glasses, electronic clothes, an electronic bracelet, an electronic necklace, an electronic appcessory, an electronic tattoo, a smart watch, and/or the like), or the like.

The electronic device may be a smart home appliance having an antenna. For example, the smart home appliance may include at least one of a television (TV), a digital versatile disc (DVD) player, an audio player, a refrigerator, an air conditioner, a cleaner, an oven, a microwave oven, a washing machine, an air purifier, a set-top box, a TV box (e.g., Samsung HomeSync®, Apple TV®, or Google TV®), a game console, an electronic dictionary, an electronic key, a camcorder, and an electronic picture frame, or the like.

The electronic device may include an antenna and may be or include one of various medical devices (e.g., magnetic resonance angiography (MRA), magnetic resonance imaging (MRI), computed tomography (CT), imaging equipment, an ultrasonic instrument, and the like), a navigation device, a global positioning system (GPS) receiver, an event data recorder (EDR), a flight data recorder (FDR), a car infotainment device, electronic equipment for a ship (e.g., a vessel navigation device, a gyro compass, and the like), avionics, a security device, a car head unit, an industrial or domestic robot, an automatic teller machine (ATM), a point of sales (POS) device, and the like.

The electronic device may be part of at least one of an item of furniture or a building/structure including an antenna. The electronic device may be an electronic board, an electronic signature input device, a projector, or any of various measurement machines (e.g., water supply, electricity, gas, a propagation measurement machine, and the like), or the like.

The electronic device may be one or more combinations of the aforementioned various devices. In addition, the electronic device may be a flexible device. Moreover, the electronic device is not limited to the aforementioned devices.

Hereinafter, an electronic device according to various example embodiments will be described with reference to the accompanying drawings. The term 'user' used in the various embodiments may refer to a person who uses the electronic device or a device which uses the electronic device (e.g., an artificial intelligence (AI) electronic device).

FIG. 1 is a diagram illustrating an example network environment 100 including an electronic device 101, according to an example embodiment of the present disclosure.

Referring to FIG. 1, the electronic device 101 may include a bus 110, a processor 120, a memory 130, an input/output interface 150, a display 160, and/or a communication interface 170. In various embodiments of the present disclosure, the electronic device 101 can omit at least one of the components or further include another component(s).

The bus 110 may include a circuit for connecting the components (e.g., the processor 120, the memory 130, the input/output interface 150, the display 160, and the communication interface 170) and delivering communications (e.g., a control message) therebetween.

The processor 120 may include one or more of a central processing unit (CPU), an application processor (AP), and a communication processor (CP). The processor 120 processes an operation or data on control of and/or communication with another component of the electronic device 101.

The processor 120, which is connected to the LTE network, may determine whether a call is connected over the CS service network using caller identification information (e.g., a caller phone number) of the CS service network (e.g., the 2G/3G network). For example, the processor 120 may receive incoming call information (e.g., a CS notification message or a paging request message) of the CS service network over the LTE network (e.g., circuit-switched fallback (CSFB)). For example, the processor 120 being connected to the LTE network may receive incoming call information (e.g., a paging request message) over the CS service network (e.g., single radio LTE (SRLTE)).

When receiving the incoming call information (e.g., a CS notification message or a paging request message) of the CS service network over the LTE network, the processor 120 may obtain caller identification information from the incoming call information. The processor 120 displays the caller identification information on the display 160. The processor 120 determines whether to connect the call based on input information corresponding to the caller identification information displayed on the display 160. For example, when detecting input information corresponding to an incoming call rejection, through the input/output interface 150, the processor 120 may restrict the voice call connection and maintains the LTE network connection. For example, when detecting input information corresponding to an incoming call acceptance, through the input/output interface 150, the processor 120 connects the voice call by connecting to the CS service network.

When receiving the incoming call information (e.g., a CS notification message or a paging request message) of the CS service network over the LTE network, the processor 120 obtains caller identification information from the incoming call information. The processor 120 may determine whether to connect the call by comparing the caller identification information with a reception control list. For example, when the caller identification information is included in a first reception control list (e.g., a blacklist), the processor 120 restricts the voice call connection and maintains the connection to the LTE network. For example, when the caller identification information is not included in the first reception control list (e.g., the blacklist), the processor 120 may connect the voice call by connecting to the CS service network. For example, when the caller identification information is included in a second reception control list (e.g., a white list), the processor 120 may connect the voice call by connecting to the CS service network.

When receiving the incoming call information (e.g., a paging request message) of the CS service network over the LTE network, the processor 120 may send an incoming call response message (e.g., a paging response message) to the CS service network. The processor 120 may suspend the LTE service and receive the caller identification information (e.g., a Circuit-switched Call (CC) setup message) from the CS service network. The processor 120 determines whether to connect the call by comparing the caller identification information with the reception control list. For example, when the caller identification information may be included in the first reception control list (e.g., the blacklist), the processor 120 may restrict the voice call connection and resume the LTE network connection. For example, when the caller identification information is not included in the first reception control list (e.g., the blacklist), the processor 120 may connect the voice call by connecting to the CS service network. For example, when the caller identification information is included in the second reception control list (e.g., the white list), the processor 120 may connect the voice call by connecting to the CS service network.

The memory 130 can include volatile and/or nonvolatile memory. The memory 130 may store commands and/or data (e.g., the reception control list) relating to at least another component of the electronic device 101. The memory 130 may store software and/or a program 140. The program 140 may include, for example, a kernel 141, middleware 143, an application programming interface (API) 145, and/or application programs (or "applications") 147. At least some of the kernel 141, the middleware 143, and/or the API 145 may be referred to as an operating system (OS).

The kernel 141 may control or manage system resources (e.g., the bus 110, the processor 120, or the memory 130) used for performing an operation or function implemented by the other programs (e.g., the middleware 143, the API 145, or the applications 147). Furthermore, the kernel 141 provides an interface through which the middleware 143, the API 145, or the applications 147 connects the individual elements of the electronic device 101 to control or manage the system resources.

The middleware 143 may function as an intermediary for allowing the API 145 or the applications 147 to communicate with the kernel 141 to exchange data.

In addition, the middleware 143 may process one or more task requests received from the applications 147 according to priorities thereof. For example, the middleware 143 assigns priorities for using the system resources (e.g., the bus 110, the processor 120, the memory 130, etc.) of the electronic device 101, to at least one of the applications 147. For example, the middleware 143 may perform scheduling or load balancing on the one or more task requests by processing the one or more task requests according to the priorities assigned thereto.

The API 145 is an interface through which the applications 147 control functions provided from the kernel 141 or the middleware 143, and may include at least one interface or function (e.g., an instruction) for file control, window control, image processing, text control, etc.

The input/output interface 150 functions as an interface that transfers instructions or data input from a user or another external device to the other element(s) of the electronic device 100. Furthermore, the input/output interface 150 may output the instructions or data received from the other element(s) of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, etc. The display 160 displays various types of content (e.g., a text, images, videos, icons, symbols, etc.) for the user. The display 160 may include a touch screen and may be responsive to, for example, a touch, a gesture, proximity, a hovering input, etc., using an electronic pen or the user's body part. The display 160 may display, for example, a web page.

The communication interface 170 can establish a communication between the electronic device 101 and an external electronic device (e.g., a first external electronic device 102, a second external electronic device 104, or a server 106). For example, the communication interface 170 can communicate with the first external electronic device 102, the second external electronic device 104, or the server 106 in connection to the network 162 through wireless communication or wired communication. For example, the wireless communication can conform to a cellular communication protocol including at least one of LTE, LTE-Advanced (LTE-A), CDMA, WCDMA, universal mobile telecommunication system (UMTS), WiBro, and GSM.

The wired communication can include at least one of universal serial bus (USB), high definition multimedia interface (HDMI), recommended standard 232 (RS-232), and plain old telephone service (POTS).

The network 162 can include at least one of telecommunications networks, for example, a computer network (e.g., local area network (LAN) or wide area network (WAN)), Internet, and a telephone network.

The electronic device 101 may provide the LTE service in the single radio environment by use of at least one module functionally or physically separated from the processor 120. Various embodiments of the present disclosure will be described with reference to a display that includes a bent or curved area and is applied to a housing of an electronic device, in which a non-metal member and a metal member (e.g., a metal bezel) are formed through dual injection molding, but are not limited thereto. For example, the display may be applied to a housing, in which a metal member or a non-metal member may be formed of a single material.

Each of the first and second external electronic devices 102 and 104 may be a type of device that is the same as or different from the electronic device 101. According to one example embodiment, the server 106 may include a group of one or more servers. According to various embodiments, all or some of the operations to be executed by the electronic device 101 may be executed by another electronic device or a plurality of other electronic devices (e.g., the electronic devices 102 and 104 or the server 106). According to one example embodiment, in the case where the electronic device 101 may perform a certain function or service automatically or by request, the electronic device 101 may request some functions that are associated therewith from the other electronic devices (e.g., the electronic devices 102 and 104 or the server 106) instead of or in addition to executing the function or service by itself. The other electronic devices (e.g., the electronic devices 102 and 104 or the server 106) may execute the requested functions or additional functions, and may transmit the results to the electronic device 101. The electronic device 101 may provide the requested functions and/or services by processing the received results. For this purpose, for example, a cloud computing technique, a distributed computing technique, or a client-server computing technique may be used.

In the description of the present disclosure, a conductive member used as an antenna radiator may be realized by a conductive member that is disposed along the outer periphery of an electronic device, but is not limited thereto. For example, various metal structures provided in the electronic device may also be used as an antenna radiator. According to an embodiment, electronic devices applied to illustrative embodiments of the present disclosure may be bar type electronic devices, but are not limited thereto. For example, the electronic devices may be electronic devices of various opening/closing types or may be wearable devices.

Figure 2:
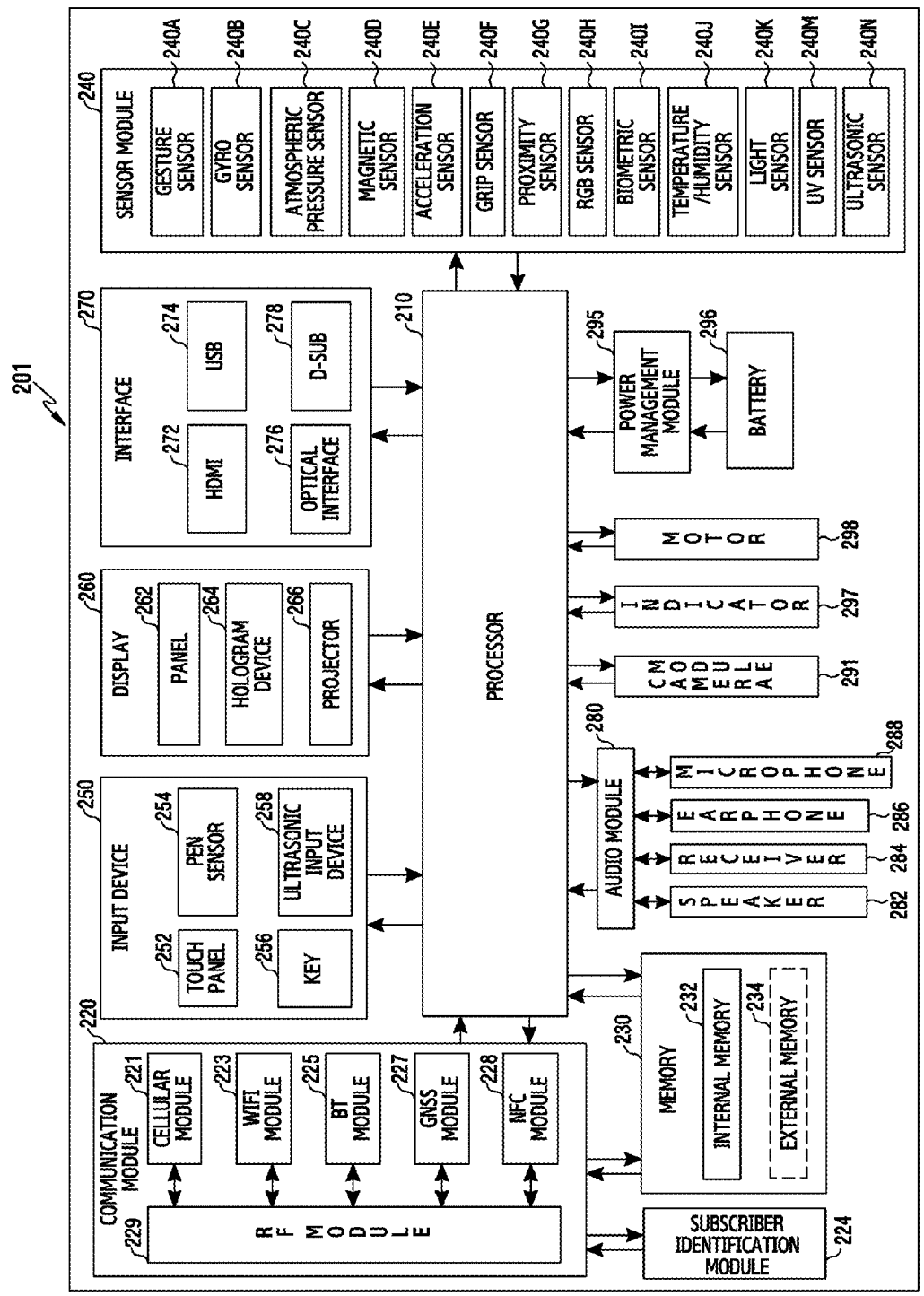
FIG. 2 is a block diagram illustrating an example electronic device according to various example embodiments of the present disclosure.

FIG. 2 is a block diagram illustrating an example configuration of an electronic device 201, according to an example embodiment of the present disclosure.

Referring to FIG. 2, a configuration of the electronic device 201 is provided. The electronic device 201 may include all or some of the components described with reference to the electronic device 101 of FIG. 1. The electronic device 201 may include at least one application processor (AP) 210, a communication module (e.g., including communication circuitry) 220, a subscriber identification module (SIM) card 224, a memory 230, a sensor module 240, an input device 250, a display 260, an interface 270, an audio module 280, a camera module 291, a power management module 295, a battery 296, an indicator 297, and/or a motor 298.

The AP 210 may control a plurality of hardware or software elements connected to the AP 210 by driving an operating system (OS) or an application program. The AP 210 processes a variety of data, including multimedia data, and performs arithmetic operations. The AP 210 may be implemented, for example, with a system on chip (SoC). The AP 210 may further include a graphical processing unit (GPU).

The communication module 220 may perform data transmission/reception in communication between the external electronic device 104 or the server 106 which may be connected with the electronic device 201 through the network 162. The communication module 220 may include various communication circuitry, such as, for example, and without limitation, a cellular module 221, a Wi-Fi module 223, a BT module 225, a global navigation satellite system (GNSS) or GPS module 227, a NFC module 228, and a radio frequency (RF) module 229.

The cellular module 221 provides a voice call, a video call, a text service, an internet service, and the like, through a communication network (e.g., LTE, LTE-A, CDMA, WCDMA, UMTS, WiBro, and GSM, and the like). In addition, the cellular module 221 may identify and authenticate the electronic device 201 within the communication network by using the SIM card 224. The cellular module 221 may perform at least some of functions that can be provided by the AP 210. For example, the cellular module 221 may perform at least some multimedia control functions.

The cellular module 221 may include a communication processor (CP). Further, the cellular module 221 may be implemented, for example, with an SoC. Although elements, such as the cellular module 221 (e.g., the CP), the memory 230, and the power management module 295 are illustrated as separate elements with respect to the AP 210 in FIG. 2, the AP 210 may also be implemented such that at least one part (e.g., the cellular module 221) of the aforementioned elements is included in the AP 210.

The AP 210 or the cellular module 221 loads an instruction or data, which is received from each non-volatile memory connected thereto or at least one of different elements, to a volatile memory and processes the instruction or data. In addition, the AP 210 or the cellular module 221 stores data, which may be received from at least one of different elements or generated by at least one of different elements, into the non-volatile memory.

Each of the Wi-Fi module 223, the BT module 225, the GNSS module 227, and/or the NFC module 228 may include a processor for processing data transmitted/received through a corresponding module. Although the cellular module 221, the Wi-Fi module 223, the BT module 225, the GNSS module 227, and the NFC module 228 are illustrated in FIG. 2 as separate blocks, at least some (e.g., two or more) of the cellular module 221, the Wi-Fi module 223, the BT module 225, the GNSS module 227, and the NFC module 228 may be included in one integrated chip (IC) or IC package. For example, at least some processors corresponding to the cellular module 221, the Wi-Fi module 223, the BT module 225, the GNSS module 227, and the NFC module 228 (e.g., a communication processor corresponding to the cellular module 221 and a Wi-Fi processor corresponding to the Wi-Fi module 223) may be implemented with an SoC.

The RF module 229 may transmit/receive data, for example an RF signal. The RF module 229 may include, for example, a transceiver, a power amp module (PAM), a frequency filter, a low noise amplifier (LNA), and the like. In addition, the RF module 229 may further include a component for transmitting/receiving a radio wave on a free space in wireless communication, for example, a conductor, a conducting wire, and the like. Although it is illustrated in FIG. 2 that the cellular module 221, the Wi-Fi module 223, the BT module 225, the GNSS module 227, and the NFC module 228 share one RF module 229, a at least one of the cellular module 221, the Wi-Fi module 223, the BT module 225, the GNSS module 227, the NFC module 228 may transmit/receive an RF signal via a separate RF module.

The SIM card 224 may be inserted into a slot formed at a specific location of the electronic device 201. The SIM card 224 includes unique identification information (e.g., an integrated circuit card identifier (ICCID)) or subscriber information (e.g., an international mobile subscriber identity (IMSI)).

The memory 230 may include an internal memory 232 and/or an external memory 234.

The internal memory 232 may include, for example, at least one of a volatile memory (e.g., a dynamic random access memory (DRAM), a static RANI (SRAM), a synchronous dynamic RAM (SDRAM), and the like) or a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, a not or (NOR) flash memory, and the like). The internal memory 232 may be a solid state drive (SSD).

The external memory 234 may include a flash drive, and may further include, for example, compact flash (CF), secure digital (SD), micro-SD, mini-SD, extreme digital (xD), memory stick, and the like. The external memory 234 may be operatively coupled to the electronic device 201 via various interfaces.

The electronic device 201 may further include a storage unit (or a storage medium), such as a hard drive.

The sensor module 240 may measure a physical quantity or detect an operation state of the electronic device 201, and may convert the measured or detected information into an electrical signal. The sensor module 240 may include, for example, at least one of a gesture sensor 240A, a gyro sensor 240B, a barometric pressure sensor or atmospheric sensor 240C, a magnetic sensor 240D, an acceleration sensor 240E, a grip sensor 240F, a proximity sensor 240G a color sensor 240H (e.g., a red, green, blue (RGB) sensor), a biometric sensor 240I, a temperature/humidity sensor 240J, an illumination/illuminance/light sensor 240K, an ultraviolet (UV) sensor 240M and ultrasonic sensor 240N.

The ultrasonic sensor 240N may include at least one ultrasonic transducer. The ultrasonic sensor 240N may include a contact type ultrasonic transducer (for example, an enclosed type ultrasonic transducer) and a non-contact type ultrasonic transducer (for example, a resonant type ultrasonic transducer), each of which are described in greater detail below. The contact type ultrasonic transducer and the non-contact type ultrasonic transducer may be controlled to be exclusively or simultaneously operated under a control of the processors 120, 220.

Additionally or alternatively, the sensor module 240 may include, for example, an E-node sensor, an electromyography (EMG) sensor, an electroencephalogram (EEG) sensor, an electrocardiogram (ECG) sensor, a fingerprint sensor, and/or the like.

The sensor module 240 may further include a control circuit for controlling at least one or more sensors included therein.

The input device 250 may include a touch panel 252, a (digital) pen sensor 254, a key 256, and/or an ultrasonic input unit 258.

The touch panel 252 may recognize a touch input, for example, by using at least one of an electrostatic type configuration, a pressure-sensitive type configuration, and/or an ultrasonic type configuration. The touch panel 252 may further include a control circuit. In the case where the touch panel is of the electrostatic type, not only is physical contact recognition possible, but proximity recognition is also possible. The touch penal 252 may further include a tactile layer, which may provide the user with a tactile reaction.

The (digital) pen sensor 254 may include, for example, a recognition sheet which is a part of the touch panel or is separated from the touch panel. The key 256 may include, for example, a physical button, an optical key, or a keypad. The ultrasonic input device 258 may detect ultrasonic waves generated by an input tool through the microphone 288, and may confirm data corresponding to the detected ultrasonic waves.

The (digital) pen sensor 254 may be implemented, for example, by using the same or similar method of receiving a touch input of the user or by using an additional sheet for recognition.

The key 256 may be, for example, a physical button, an optical key, a keypad, and/or a touch key.

The ultrasonic input unit 258 may be a device by which the electronic device 201 detects a reflected sound wave through a microphone 288 and is capable of radio recognition. For example, an ultrasonic signal, which may be generated by using a pen, may be reflected off of an object and detected by the microphone 288.

The electronic device 201 may use the communication module 220 to receive a user input from an external device (e.g., a computer or a server) connected thereto.

The display 260 may include a panel 262, a hologram 264, and/or a projector 266.

The panel 262 may be, for example, a liquid-crystal display (LCD), an active-matrix organic light-emitting diode (AM-OLED), and/or the like. The panel 262 may be implemented, for example, in a flexible, transparent, or wearable manner. The panel 262 may be constructed as one module with the touch panel 252.

The hologram device 264 may use an interference of light and may display a stereoscopic image in the air.

The projector 266 may display an image by projecting a light beam onto a screen. The screen may be located inside or outside the electronic device 201.

The display 260 may further include a control circuit for controlling the panel 262, the hologram device 264, or the projector 266.

The interface 270 may include, for example, an HDMI 272, a USB 274, an optical communication interface 276, and/or a D-subminiature (D-sub) 278. The interface 270 may be included, for example, in the communication interface 160 of FIG. 1. Additionally or alternatively, the interface 270 may include, for example, mobile high-definition link (MHL), SD/multi-media card (MMC) and/or infrared data association (IrDA).

The audio module 280 may bilaterally convert a sound and an electric signal. At least some elements of the audio module 280 may be included in the input/output interface 150 of FIG. 1. The audio module 280 may convert sound information which is input or output through a speaker 282, a receiver 284, an earphone 286, the microphone 288, and/or the like.

The speaker 282 may output a signal of an audible frequency band and a signal of an ultrasonic frequency band. Reflected waves of an ultrasonic signal emitted from the speaker 282 may be received, or a signal of an external audible frequency band may also be received.

The camera module 291 may be a device for image and/or video capturing, and may include one or more image sensors (e.g., a front sensor or a rear sensor), a lens, an image signal processor (ISP), and/or a flash (e.g., an LED or a xenon lamp). In certain instances, it may prove advantageous to include two or more camera module.

The power management module 295 manages power of the electronic device 201. The power management module 295 may include a power management integrated circuit (PMIC), a charger IC, or a battery gauge.

The PMIC may be placed inside an IC or SoC semiconductor. Charging is classified into wired charging and wireless charging. The charger IC may charge a battery and may prevent an over-voltage or over-current flow from a charger. The charger IC may include a charger IC for at least one of the wired charging and the wireless charging.

The wireless charging may be classified, for example, into a magnetic resonance type, a magnetic induction type, and an electromagnetic type. An additional circuit for the wireless charging, for example, a coil loop, a resonant circuit, a rectifier, and the like, may be added.

The battery gauge may measure, for example, a residual quantity of the battery 296 and a voltage, current, and/or temperature during charging. The battery 296 stores or generates electricity and supplies power to the electronic device 201 by using the stored or generated electricity. The battery 296 may include a rechargeable battery or a solar battery.

The indicator 297 may indicate a specific state, for example, a booting state, a message state, a charging state, and/or the like, of the electronic device 201 or a part thereof (e.g., the AP 210).

The motor 298 may convert an electric signal into a mechanical vibration.

The electronic device 201 may include a processing unit (e.g., a GPU) for supporting mobile TV. The processing unit for supporting mobile TV processes media data according to a protocol of, for example, digital multimedia broadcasting (DMB), digital video broadcasting (DVB), media flow, and/or the like.

Each of the aforementioned elements of the electronic device 201 may include one or more components, and names thereof may vary depending on a type of the electronic device 201. The electronic device 201 may include at least one of the aforementioned elements. Some of the elements may be omitted, or additional other elements may be further included. In addition, some of the elements of the electronic device 201 may be combined and constructed as one entity, so as to equally perform functions of corresponding elements before combination.

At least some parts of a device (e.g., modules or functions thereof) or method (e.g., operations) may be implemented with an instruction stored in a computer-readable storage media for example. The instruction may be executed by the processor 210, to perform a function corresponding to the instruction. The computer-readable storage media may be, for example, the memory 230. At least some parts of the programming module may be implemented (e.g., executed), for example, by the processor 210. At least some parts of the programming module may include modules, programs, routines, a set of instructions, processes, and the like, for performing one or more functions.

Figure 3A:
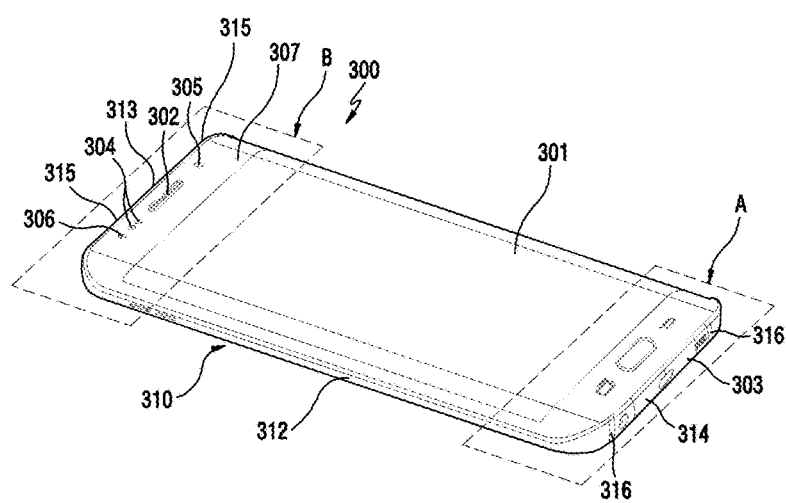
FIG. 3A is a front perspective view illustrating an example electronic device according to various example embodiments of the present disclosure.

FIG. 3A is a front perspective view of an example electronic device 300 according to various example embodiments of the present disclosure.

Referring to FIG. 3A, the electronic device 300 may have a display 301 disposed on the front 307 thereof. A speaker device 302 for transmitting a counterpart's speech may be disposed on the upper side of the display 301. A microphone device 303 for transmitting an electronic device user's speech to a counterpart may be disposed on the lower side of the display 301.

According to an embodiment, components for performing various functions of the electronic device 300 may be arranged around the speaker device 302. The components may include at least one sensor module 304. The sensor module 304, according to various embodiments, may include, for example, at least one of an illuminance sensor (e.g., an optical sensor), a proximity sensor, an infrared sensor, and an ultrasonic sensor. According to an embodiment, the components may also include a camera device 305. According to an embodiment, the components may also include an LED indicator 306 for informing a user of the state information of the electronic device 300.

According to various embodiments, the electronic device 300 may include a conductive sidewall 310. For example, the conductive sidewall 310 may be disposed, as a part, in at least one area of a metal housing or within the metal housing. According to an embodiment, the conductive sidewall 310 may be disposed along the outer periphery of the electronic device 300 and may extend to at least one area of the back of the electronic device 300, which is connected to the outer periphery. According to an embodiment, the conductive sidewall 310 may define the thickness of the electronic device along the outer periphery of the electronic device 300, and may be formed in a loop shape. Without being limited thereto, however, the conductive sidewall 310 may be formed to contribute to at least a part of the thickness of the electronic device 300. According to an embodiment, the conductive sidewall 310 may be disposed in at least one area of the outer periphery of the electronic device 300. According to an embodiment, the conductive sidewall 310 may include one or more cut-off portions 315 and 316. According to an embodiment, the cut-off portions 315 and 316 may be filled with a non-conductive material (e.g., a synthetic resin). According to an embodiment, unit conductive members separated by the cut-off portions 315 and 316 may be used as antenna radiators that operate in at least one frequency band.

Figure 3B:
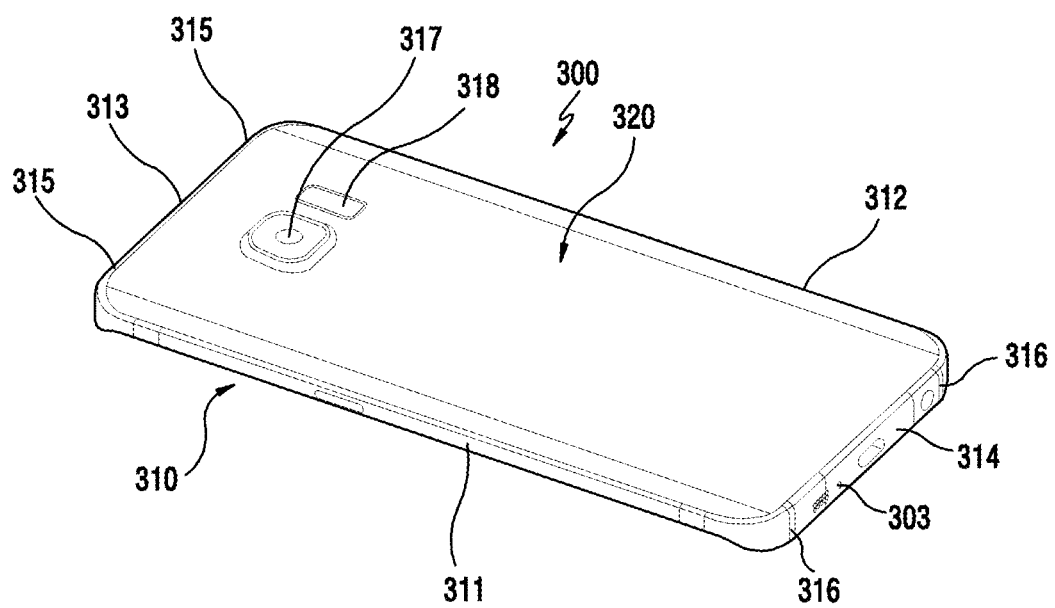
FIG. 3B is a rear perspective view illustrating the electronic device according to various example embodiments of the present disclosure.

According to various embodiments, the conductive sidewall 310 may have a loop shape along the outer periphery of the electronic device and may be disposed to serve as the entirety or a part of the thickness of the electronic device 300. According to an embodiment, the conductive sidewall 310 may include a right conductive sidewall 311 as illustrated in FIG. 3B, a left conductive sidewall 312, an upper conductive sidewall 313, and a lower conductive side 314 when the electronic device 300 is viewed from the front.

According to various embodiments, an antenna device, according to an embodiment of the present disclosure, may be disposed in the lower area (area A) or the upper area (area B) of the electronic device 300. According to an embodiment, the lower conductive sidewall 314 may be used as an antenna radiator by virtue of one pair of cut-off portions 316. According to an embodiment, the upper conductive sidewall 315 may be used as an antenna radiator by virtue of one pair of cut-off portions 315. According to an embodiment, the lower and upper conductive sidewalls 314 and 313 may serve as antenna radiators that operate in at least two operating frequency bands according to feeding positions.

According to various embodiments, at least one conductive sidewall separated by the cut-off portions may be used in major communication bands, such as a low band of 700 MHz to 990 MHz, a mid band of 2300 MHz to 2700 MHz, a high band of 2300 MHz to 2700 MHz, and the like. According to an embodiment, the conductive sidewall may also be used in various wireless communication service bands, such as BT, GPS, WIFI, etc.

According to various embodiments, at least one conductive sidewall separated by the cut-off portions may be used for voice/data communication (GPRS, WCDMA, LTE, etc.) that is the major communication of the electronic device. For example, the conductive sidewall disposed on the lower side of the electronic device, where a metal component that degrades the performance of an antenna is located, may be used as an antenna radiator. According to an embodiment, based on the European standard, the conductive sidewall may implement a total of 24 bands, including 2G (GSM850, EGSM, DCS, and PCS), WCDMA (B1, B2, B5, and B8), and/or LTE (B1, B2, B3, B4, B5, B7, B8, B12, B17, B18, B19, B20, B26, B38, B39, B40, and B41). According to an embodiment, the conductive sidewall may be implemented as an antenna by combining service bands that have similar frequency bands over at least two areas. According to an embodiment, one conductive sidewall may be implemented as an antenna radiator that operates in a 2G (GSM850, EGSM, DCS, and PCS), WCDMA (B1, B2, B5, and B8), and/or LTE (B1, B2, B3, B4, B5, B8, B12, B17, B18, B19, B20, B26, and B39) band, and another conductive sidewall may be implemented as an antenna radiator that operates in an LTE (B7, B38, B40, and B41) band. According to various embodiments, the antenna device may be disposed in a position that is less affected when the electronic device 300 is held. For example, the antenna device may be disposed in at least a part of the illustrated area A or B of the electronic device 300. Without being limited thereto, however, the antenna device may also be disposed lengthwise on at least one of the opposite side surfaces of the electronic device 300 other than in the area A or B.

FIG. 3B is a rear perspective view of the electronic device 300 according to various embodiments of the present disclosure.

Referring to FIG. 3B, a cover member 320 may be additionally disposed on the back of the electronic device 300. The cover member 320 may be a battery cover for protecting a battery pack that is detachably equipped to the electronic device 300 and for making the external appearance of the electronic device 300 appealing. Without being limited thereto, however, the cover member 320 may be integrated with the electronic device 300 to serve as the rear housing of the electronic device 300. According to an embodiment, the cover member 320 may be formed of various materials, such as metal, glass, a composite material, a synthetic resin, etc. According to an embodiment, a camera device 317 and a flash 318 may be disposed on the back of the electronic device 300.

According to various embodiments, if the battery pack is integrally employed within the electronic device 300, the cover member 320 may be replaced by the rear housing of the electronic device 300. According to an embodiment, for example, at least one area of the rear housing, which constitutes the external appearance of the electronic device 300, may also be formed of metal and may serve as an antenna member.

Figure 3C:
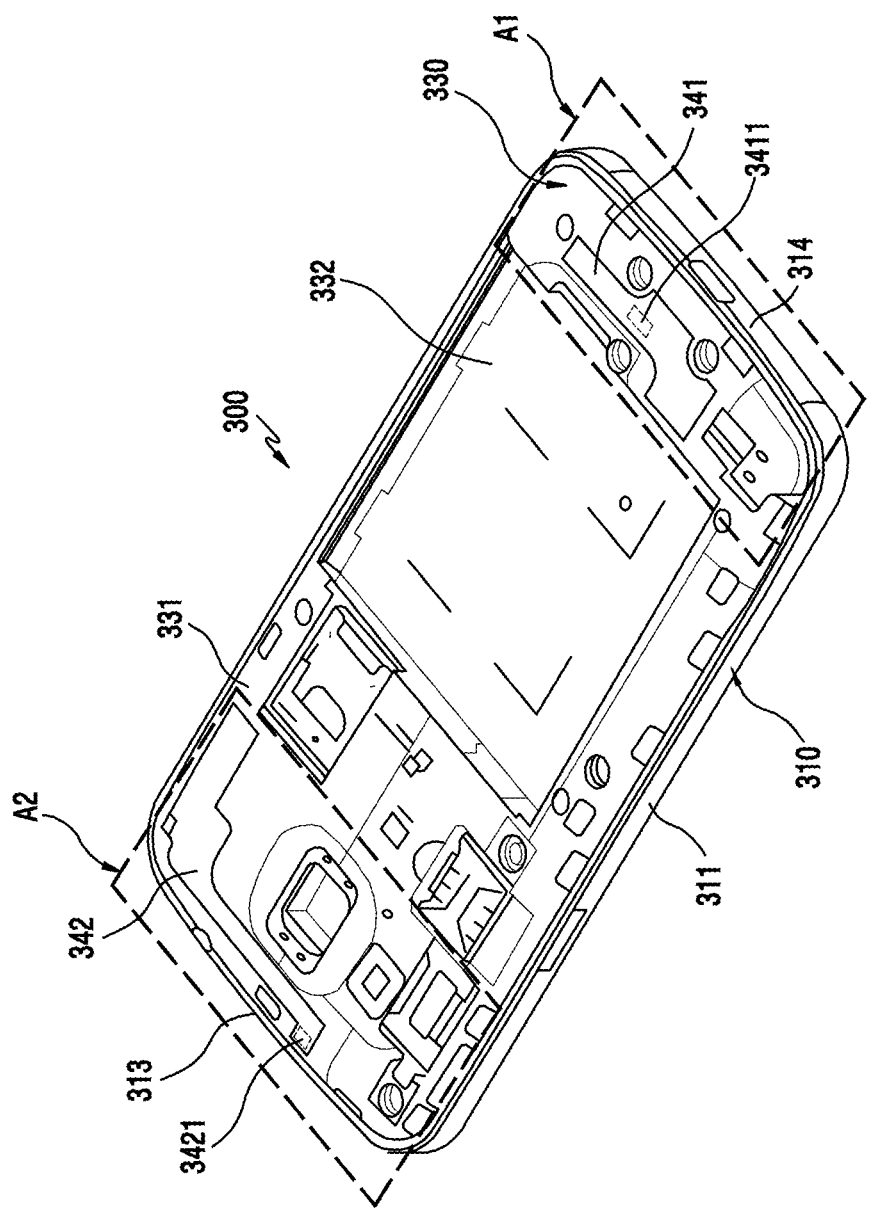
FIG. 3C is a diagram illustrating a state in which a conductive pattern has been formed in the housing of the electronic device according to various example embodiments of the present disclosure.

FIG. 3C is a perspective view illustrating a state in which a conductive pattern is disposed in the housing 330 of the electronic device 300 according to various embodiments of the present disclosure.

FIG. 3C illustrates the configuration of a cover-member mounting part 331 of the housing 331 from which the cover member 320 of the electronic device 300 is excluded.

According to an embodiment, the cover-member mounting part 331 may include a battery pack mounting part 332 for accommodating a battery pack.

According to various embodiments, the electronic device 300 may have conductive patterns 341 and 342 disposed in area A1 and/or area A2 of the cover-member mounting part 331. According to an embodiment, the first conductive pattern 341 may be disposed in the area A1 that is on the lower side of the electronic device 300. According to an embodiment, the second conductive pattern 342 may be disposed in the area A2 that is on the upper side of the electronic device 300. According to an embodiment, conductive members 3411 and 3421 may be included in the conductive patterns 341 and 342, respectively. According to an embodiment, the conductive members 3411 and 3421 may extend from the conductive sidewall so as to be exposed, or may be independently formed (as metal islands) without extension and may be electrically connected to a printed circuit board through a connecting member (e.g., a C-clip, etc.). Accordingly, the conductive patterns 341 and 342, which are disposed on the conductive members 3411 and 3421, may be electrically connected to the printed circuit board (e.g., a PCB, an FPCB, etc.) through the conductive members 3411 and 3421.

According to various embodiments, the first conductive pattern 341 may be used as a parasitic antenna radiator of the lower conductive sidewall 314 that is used as an antenna radiator when the first conductive pattern 341 is electrically connected with the lower conductive sidewall 314 through the conductive member 3411. According to an embodiment, the first conductive pattern 341 may also be used as an independent antenna radiator when the first conductive pattern 341 is independently connected to the printed circuit board through the conductive member 3411 without being connected with the lower conductive sidewall 314.

According to various embodiments, the second conductive pattern 342 may be used as a parasitic antenna radiator of the upper conductive sidewall 313 that is used as an antenna radiator when the second conductive pattern 342 is electrically connected with the upper conductive sidewall 313 through the conductive member 3421. According to an embodiment, the second conductive pattern 342 may also be used as an independent antenna radiator when the second conductive pattern 342 is independently connected to the printed circuit board through the conductive member 3421 without being connected with the upper conductive sidewall 313.

According to various embodiments, the conductive patterns 341 and 342 may be disposed to at least partially overlap the conductive members 3411 and 3421 that are exposed through the housing. According to an embodiment, the conductive patterns 341 and 342 may be Direct Printed Antennas (DPAs) that are directly formed on the outer surface of the housing. Without being limited thereto, however, the conductive patterns 341 and 342 may include various conductive patterns that are simultaneously disposed on all conductive members through which a conductive sidewall made of a different material from that of the outer surface of the housing is exposed.

Figure 3D:
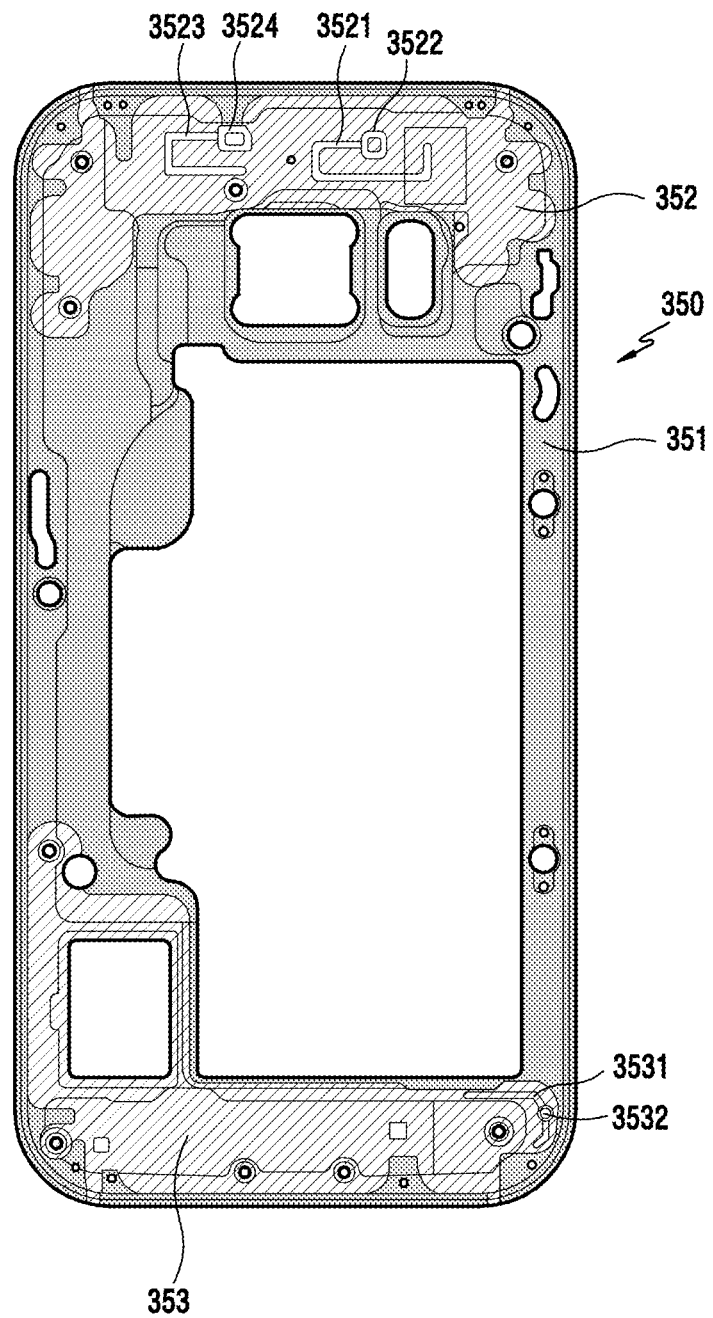
FIG. 3D illustrates an example configuration of a housing made of heterogeneous materials, which includes conductive patterns, according to various example embodiments of the present disclosure.
Figure 3E:
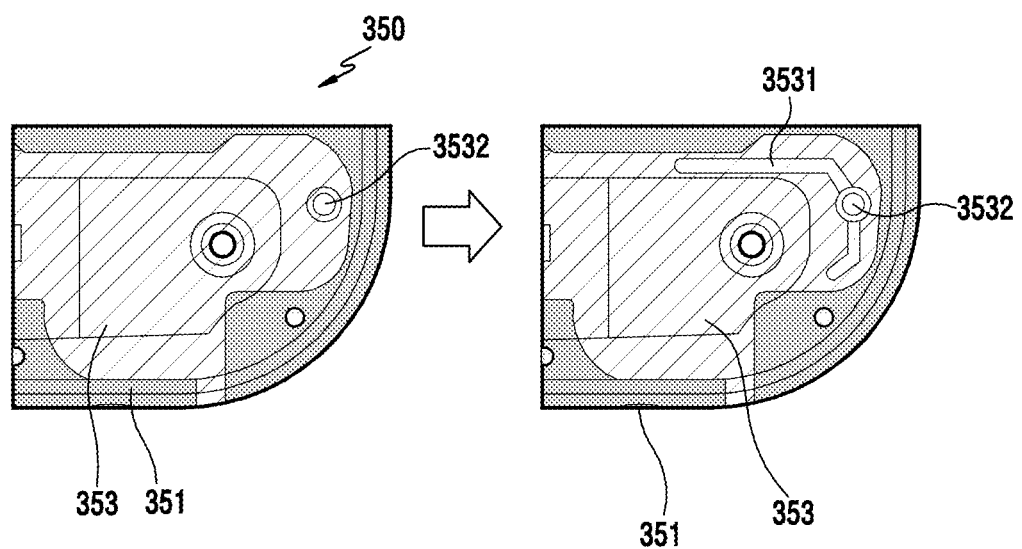
FIG. 3E is a diagram illustrating major parts of the housing, which is illustrated in FIG. 3D, according to various example embodiments of the present disclosure.

FIG. 3D illustrates the configuration of a housing 350 made of heterogeneous materials, which includes conductive patterns 3521, 3523, and 3531, according to various embodiments of the present disclosure. FIG. 3E illustrates major parts of the housing 350, which is illustrated in FIG. 3D, according to various embodiments of the present disclosure. The housing 350 of FIGS. 3D and 3E may be an embodiment of a housing that is similar to, or different from, the housing 330 of FIG. 3C.

Referring to FIG. 3D, the housing 350 may be disposed in at least one area of the electronic device. According to an embodiment, the housing 350 may include a conductive sidewall 351 and non-conductive members 352 and 353 that are formed on the conductive sidewall 351 through double injection molding. Without being limited thereto, however, the non-conductive members 352 and 353 may be coupled to the conductive sidewall 351 through insert molding. According to an embodiment, the conductive sidewall 351 may be disposed such that at least a part thereof is exposed along the outer periphery of the electronic device. According to an embodiment, the conductive sidewall 351 may also be disposed such that at least one area thereof extends toward the inside of the electronic device.

According to various embodiments, the housing 350 may include one or more non-conductive members 352 and 353. According to an embodiment, the non-conductive members 352 and 353 may include the first non-conductive member 352 disposed in a first area of the housing 350 and the second non-conductive member 353 disposed in a second area of the housing 350. Without being limited thereto, however, the housing 350 may also include one or more non-conductive members that are separated from each other.

According to various embodiments, one pair of conductive patterns 3521 and 3523 may be disposed on the first non-conductive member 352. According to an embodiment, the conductive patterns 3521 and 3523 may operate as antenna radiators while being separated from each other. According to an embodiment, one of the conductive patterns 3521 and 3523 may operate as a single antenna radiator in conjunction with the other conductive pattern. According to an embodiment, the second non-conductive member 353 may also have the conductive pattern 3531 disposed thereon, and the conductive pattern 3531 may also operate as an antenna radiator.

Referring to FIG. 3E, the conductive pattern 3531 may include a conductive member (not illustrated) that extends from the conductive sidewall 351 and is substantially disposed in the non-conductive member 353. According to an embodiment, a conductive structure 3532, according to an illustrative embodiment of the present disclosure, may be interposed between the conductive member of the conductive sidewall 351 and the conductive pattern 3531 to establish an electrical connection between the conductive member and the conductive pattern 3531.

According to various embodiments, a conductive pattern may be disposed on the boundary portion where members made of heterogeneous materials are coupled. According to an embodiment, since the conductive structure is disposed between the conductive pattern and the conductive sidewall, it is possible to prevent, in advance, the crack of the conductive pattern, which may be caused by the boundary portion between the heterogeneous materials, even though an external impact is applied to the electronic device. According to an embodiment, even though the crack happens, the conductive, structural, and electrical connection between the conductive pattern and the conductive sidewall may be consistently maintained through the conductive structure so that it is possible to prevent, in advance, a degradation in the performance of the antenna device.

Figure 4A:
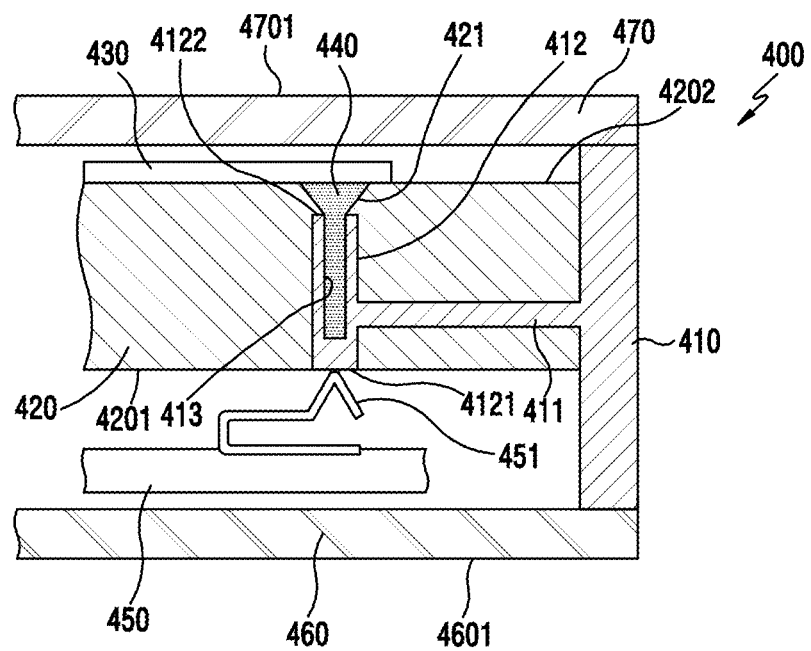
FIGS. 4A and 4B are diagrams illustrating an example configuration for electrically connecting a conductive sidewall and a conductive pattern according to various example embodiments of the present disclosure.
Figure 4B:
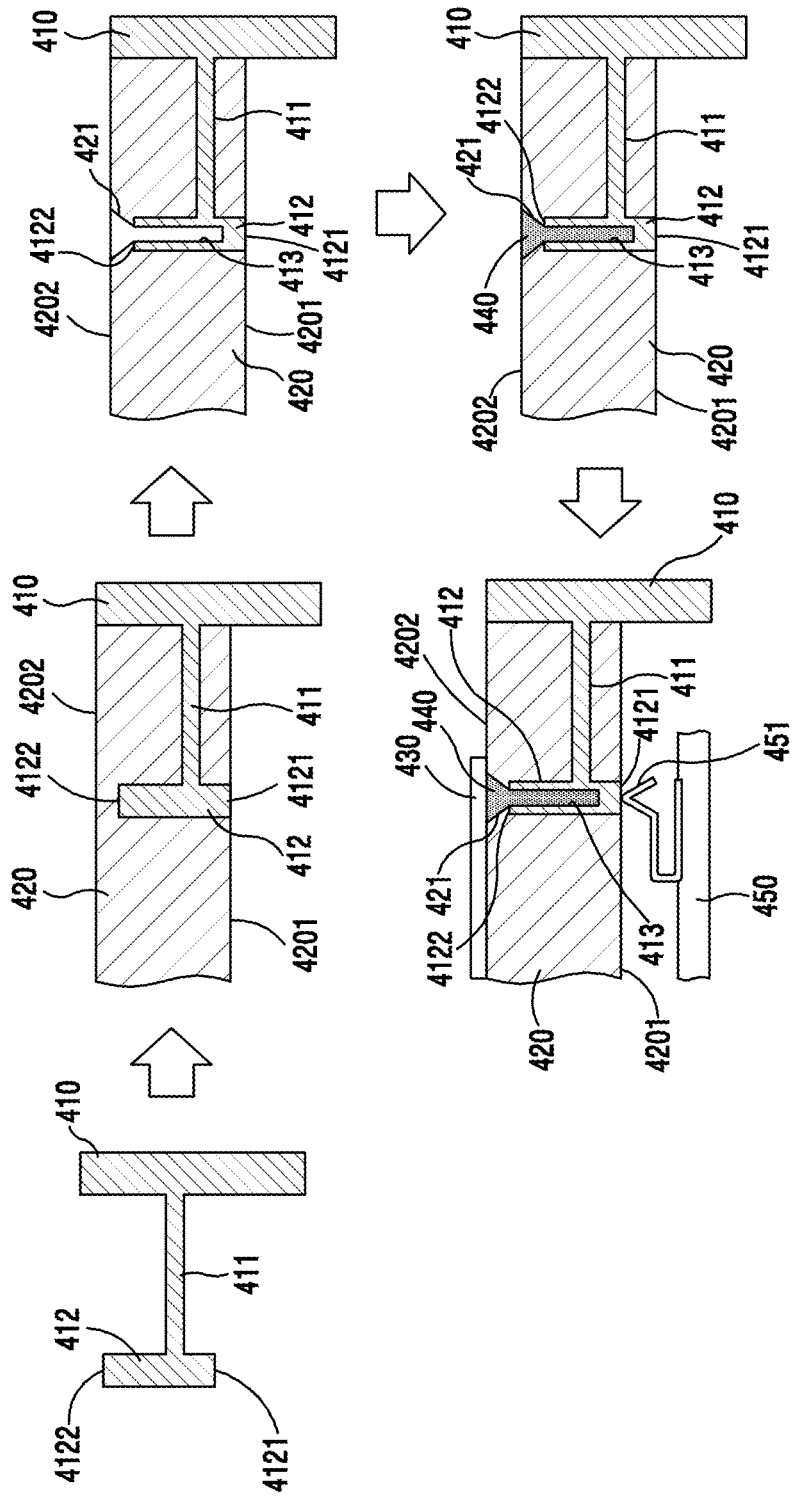

FIGS. 4A and 4B are diagrams illustrating an example configuration for electrically connecting a conductive sidewall 410 and a conductive pattern 430 according to various embodiments of the present disclosure.

The conductive sidewall 410 of FIGS. 4A and 4B is an embodiment of a conductive sidewall that is similar to, or different from, the conductive sidewall 310 of FIG. 3A.

Referring to FIG. 4A, an electronic device may include a first cover 460 that forms a first surface 4601 and a second cover 470 that is opposite to the first surface 4601 of the first cover 460 and forms a second surface 4701 of the electronic device. According to an embodiment, a housing 400 may be disposed to at least partially surround at least a part of the space formed between the first cover 460 and the second cover 470. According to an embodiment, the housing 400 may be formed by combining heterogeneous materials. According to an embodiment, the housing 400 may include: the conductive sidewall 410; and a non-conductive member 420 made of a synthetic resin, which is formed on the conductive sidewall 410 through double injection molding. According to an embodiment, the conductive sidewall 410 may be disposed to be exposed through one area (e.g., metal bezel, etc.) of the external appearance of the electronic device. According to an embodiment, the conductive sidewall 410 may also serve as a metal structure (e.g., a metal bushing, a reinforcing piece, etc.) within the electronic device.

According to various embodiments, the conductive sidewall 410 may include a conductive member 412 that is connected thereto through a connecting part 411. According to an embodiment, a first surface 4121 of the conductive member 412 may be disposed to be exposed through a first surface 4201 of the non-conductive member 420. According to an embodiment, a second surface 4122 that is opposite to the first surface 4121 of the conductive member 412 may be disposed so as to not be exposed through a second surface 4202 that is opposite to the first surface 4201 of the non-conductive member 420. According to an embodiment, the first surface 4121 of the conductive member 412, which is exposed through the first surface 4201 of the non-conductive member 420, may be electrically connected with a printed circuit board 450 through a physical contact with a connecting member 451 (e.g., a C-clip, a metal spring, a conductive tape, etc.) that is disposed on the printed circuit board 450. According to an embodiment, the connecting member 451 may include a C-clip or a metal spring, which is mounted on the printed circuit board 450. According to an embodiment, the connecting member 451 may include a conductive tape with a specified thickness, which is attached to the printed circuit board 450. According to an embodiment, the second surface of the conductive member 412 may not be exposed through the second surface of the non-conductive member 420, and may have a bore 413 formed therein lengthwise. According to an embodiment, the bore 413 may be filled or coated with a conductive structure 440 to be described below such that the conductive structure 440 may serve to electrically connect the conductive member 412 with the conductive pattern 430.

According to various embodiments, the non-conductive member 420 may have a through-hole 421 that extends from the second surface 4202 thereof to the bore 413 of the conductive member 412. According to an embodiment, the through-hole 421 may be formed to communicate with the bore 413 of the conductive member 412.

According to various embodiments, through the through-hole 421, the bore 413 may be filled or coated with the conductive structure (material) 440. According to an embodiment, a conductive epoxy resin with viscosity, a conductive ink, a polymer, a conductive material dispersed in the polymer, or the like may be used as the conductive structure 440. According to an embodiment, the bore 413, which is formed in the conductive member 412 of the conductive sidewall 410, may be filled or coated with the conductive structure 440 through the through-hole of the non-conductive member 420. According to an embodiment, the conductive structure 440 may be applied to a height that is the same as, or slightly higher than, that of the second surface 4202 of the non-conductive member 420.

According to various embodiments, the conductive pattern 430 may be disposed on at least one area of the second surface of the non-conductive member 420. According to an embodiment, the conductive pattern 430 may be a Direct Printed Antenna (DPA) that is disposed on the second surface 4202 of the non-conductive member 420. According to an embodiment, the conductive pattern 430 may be used as an antenna radiator by forming a conductive layer on at least one area of the second surface 4202 of the non-conductive member through a process, such as printing, plating, painting, etc. According to an embodiment, the conductive pattern 430 may be disposed to cover the area of the conductive structure 440 that is exposed through the second surface 4202 of the non-conductive member 420. Accordingly, the conductive pattern 430 may be electrically connected to the printed circuit board 450 through the conductive structure 440, the conductive member 412, and the connecting member 451. According to an embodiment, the through-hole 421 may be formed in a funnel shape that has a gradually increasing diameter toward the upper portion thereof in order to increase the electrical contact area between the conductive pattern 430 and the conductive structure 440 to the maximum. According to an embodiment, a conductive epoxy resin with viscosity, a conductive ink, a polymer, a conductive material dispersed in the polymer, or the like may be used as the conductive structure 440. According to an embodiment, the conductive epoxy resin may be obtained by mixing conductive particles or powder with a viscous thermoplastic resin so as to make a non-conductive epoxy resin conductive.

According to various embodiments, although the conductive sidewall 410 and the conductive pattern 430 are used as an antenna radiator while being electrically connected with each other, the conductive pattern 430 may be used as an independent antenna radiator when the conductive member 412 is separated and insulated from the conductive sidewall 410 (for example, in the case of a metal island). However, without being limited thereto, the conductive sidewall 410 and the conductive pattern 430 may perform a coupling operation to serve as a parasitic antenna radiator for each other even though the conductive member 412 is separated and insulated from the conductive sidewall 410. According to an embodiment, if the conductive member 412 is formed of a non-conductive material, the conductive member may be electrically insulated from the conductive sidewall 410, and a crack may be prevented by the conductive sidewall 410.

Referring to FIG. 4B, the conductive sidewall 410 may be provided. According to an embodiment, the conductive sidewall 410 may include the conductive member 412 that is disposed to be spaced a specified distance apart from the conductive sidewall 410 through the connecting part 411. According to an embodiment, the conductive sidewall 410, the connecting part 411, and the conductive member 412 may be integrally formed with each other. According to an embodiment, the conductive sidewall 410 may be formed through a process, such as injection molding, die-casting, etc.

According to various embodiments, the housing 400 may be manufactured by coupling the non-conductive member 420 made of a synthetic resin to the conductive sidewall 410 through double injection molding. According to an embodiment, the non-conductive member 420 may also be coupled with the conductive sidewall 410 through insert molding. According to an embodiment, the non-conductive member 420 may also be coupled with the conductive sidewall 410 through a structural shape. Then, the filling or coating areas 412 and 413 to which the conductive structure 440 is to be applied may be formed from the second surface 4202 of the non-conductive member 420 to the conductive member 412 of the conductive sidewall 410. According to an embodiment, the through-hole 421 may be formed from the second surface 4202 of the non-conductive member 420 to the second surface 4122 of the conductive member 412, and the bore 413 may be formed lengthwise in the conductive member 412, which is exposed through the through-hole 421, so as to be connected with the through-hole 421. However, without being limited thereto, the bore 413 of the conductive member 412 may be formed by forming the bore 413 first when forming the conductive sidewall 410, coupling the non-conductive member 420 to the conductive sidewall 410 through double injection molding, and then removing the non-conductive member 420 filling the bore 413. Thereafter, the through-hole 421 of the non-conductive member 420 and the bore 413 of the conductive member 412 may be filled or coated with the conductive structure 440, and the conductive pattern 430 may be disposed to cover the conductive structure 440 that is exposed through the second surface 4202 of the non-conductive member 420.

According to various embodiments, the conductive structure 440, which is provided in order to electrically connect the conductive member 412 of the conductive sidewall 410 and the conductive pattern 430, may be formed of a viscous material, which makes it possible to prevent the crack of the conductive pattern 430 that may be formed by an external impact in the boundary area between the members made of heterogeneous materials, and to effectively maintain the electrical connection between the conductive pattern 430 and the conductive member 412 through the conductive structure 440 even though the crack of the conductive pattern happens.

Figure 5A:
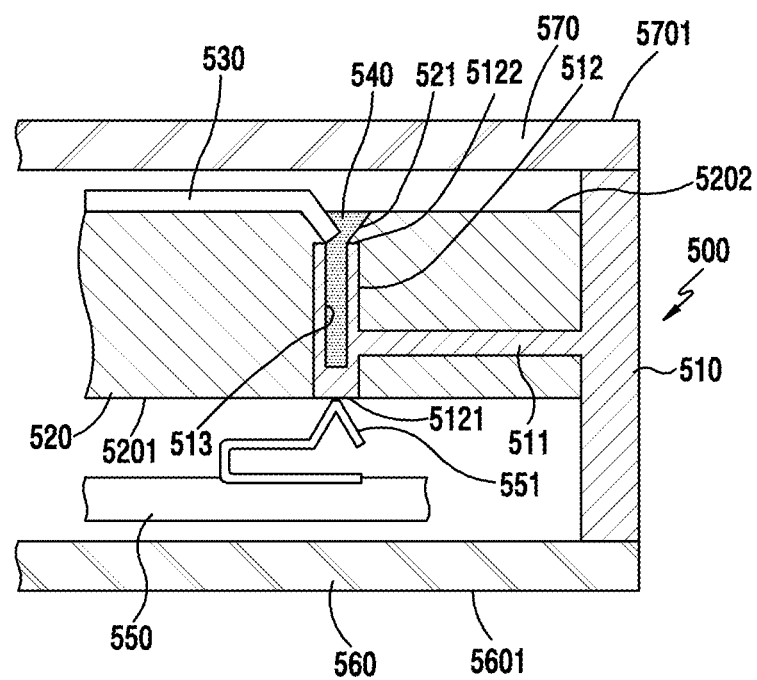
FIGS. 5A and 5B are diagrams illustrating an example configuration for electrically connecting a conductive sidewall and a conductive pattern according to various example embodiments of the present disclosure.
Figure 5B:
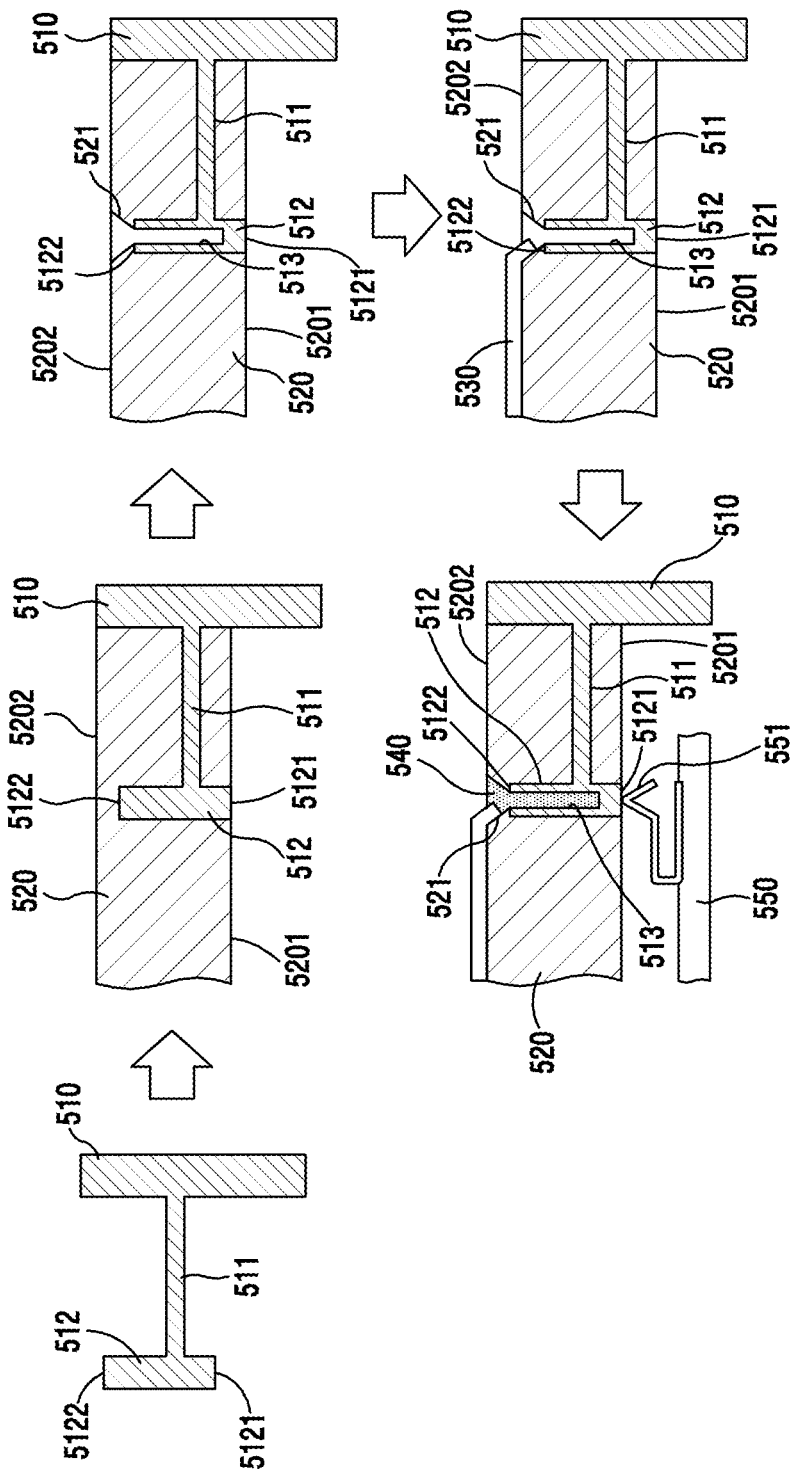

FIGS. 5A and 5B are diagrams illustrating an example configuration for electrically connecting a conductive sidewall and a conductive pattern according to various example embodiments of the present disclosure.

The conductive sidewall 510 of FIGS. 5A and 5B is an embodiment of a conductive sidewall that is similar to, or different from, the conductive sidewall 310 of FIG. 3A.

Referring to FIG. 5A, an electronic device may include a first cover 560 that forms a first surface 5601 and a second cover 570 that is opposite to the first surface 5601 of the first cover 560 and forms a second surface 5701 of the electronic device. According to an embodiment, a housing 500 may be disposed around or to surround at least a part of the space formed between the first cover 560 and the second cover 570. According to an embodiment, the housing 500 may be formed by combining heterogeneous materials. According to an embodiment, the housing 500 may include: the conductive sidewall 510; and a non-conductive member 520 made of a synthetic resin, which is formed on the conductive sidewall 510 through double injection molding. According to an embodiment, the conductive sidewall 510 may be disposed to be exposed through one area (e.g., metal bezel, etc.) of the external appearance of the electronic device. According to an embodiment, the conductive sidewall 510 may also serve as a metal structure (e.g., a metal bushing, a reinforcing piece, etc.) within the electronic device.

According to various embodiments, the conductive sidewall 510 may include a conductive member 512 that is connected thereto through a connecting part 511. According to an embodiment, a first surface 5121 of the conductive member 512 may be disposed to be exposed through a first surface 5201 of the non-conductive member 520. According to an embodiment, a second surface 5122 that is opposite to the first surface 5121 of the conductive member 512 may be disposed so as to not be exposed through a second surface 5202 that is opposite to the first surface 5201 of the non-conductive member 520. According to an embodiment, the first surface 5121 of the conductive member 512, which is exposed through the first surface 5201 of the non-conductive member 520, may be electrically connected with a printed circuit board 550 through a physical contact with a connecting member 551 (e.g., a C-clip, a metal spring, a conductive tape, etc.) that is disposed on the printed circuit board 550. According to an embodiment, the connecting member 551 may include a C-clip or a metal spring, which is mounted on the printed circuit board 550. According to an embodiment, the connecting member 551 may include a conductive tape with a specified thickness, which is attached to the printed circuit board 550. According to an embodiment, the conductive member 512 may not be exposed through the second surface 5202 of the non-conductive member 520, and may have a bore 513 formed therein lengthwise. According to an embodiment, the bore 513 may be filled or coated with a conductive structure 540 to be described below such that the conductive structure may serve to electrically connect the conductive member 512 with the conductive pattern 530.

According to various embodiments, the non-conductive member 520 may have a through-hole 521 that extends from the second surface 5202 thereof to the bore 513 of the conductive member 512. According to an embodiment, the through-hole 521 may be formed to communicate with the bore 513 of the conductive member 512.

According to various embodiments, through the through-hole 521, the bore 513 may be filled or coated with the conductive structure (material) 540. According to an embodiment, the bore 513, which is formed in the conductive member 512 of the conductive sidewall 510, may be filled or coated with the conductive structure 540 through the through-hole 521 of the non-conductive member 520. According to an embodiment, the conductive structure 540 may be applied to a height that is the same as, or slightly higher than, that of the second surface 5202 of the non-conductive member 520.

According to various embodiments, the conductive pattern 530 may be formed on the second surface 5202 of the non-conductive member 520. According to an embodiment, the conductive pattern 530 may be a Direct Printed Antenna (DPA) that is disposed on the upper surface of the non-conductive member 520. According to an embodiment, the conductive pattern 530 may be used as an antenna radiator by forming a conductive layer on at least one area of the second surface 5202 of the non-conductive member through a process, such as printing, plating, painting, etc. According to an embodiment, the conductive pattern 530 may extend from the second surface 5202 of the non-conductive member 520 to a part of the through-hole 521. According to an embodiment, the bore 513 and the through-hole 521 may be filled or coated with the conductive structure 540, with the conductive pattern 530 extending to at least one area of the through-hole 521. Accordingly, the conductive pattern 530 may be electrically connected to the printed circuit board 550 through the conductive structure 540, the conductive member 512, and the connecting member 551. According to an embodiment, the through-hole 521 may be formed in a funnel shape that has a gradually increasing diameter toward the upper portion thereof in order to increase the electrical contact area between the conductive pattern 530 and the conductive structure 540 to the maximum. According to an embodiment, a conductive epoxy resin with viscosity, a conductive ink, a polymer, a conductive material dispersed in the polymer, or the like may be used as the conductive structure 540. According to an embodiment, the conductive epoxy resin may be obtained by mixing conductive particles or powder with a viscous thermoplastic resin so as to make a non-conductive epoxy resin conductive.

According to various embodiments, although the conductive sidewall 510 and the conductive pattern 530 are used as an antenna radiator while being electrically connected with each other, the conductive pattern 530 may be used as an independent antenna radiator when the conductive member 512 is separated and insulated from the conductive sidewall 510 (for example, in the case of a metal island). However, without being limited thereto, the conductive sidewall 510 and the conductive pattern 530 may perform a coupling operation to serve as a parasitic antenna radiator for each other even though the conductive member 512 is separated and insulated from the conductive sidewall 510. According to an embodiment, if the conductive member 512 is formed of a non-conductive material, the conductive member may be electrically insulated from the conductive sidewall 510, and a crack may be prevented by the conductive sidewall 510.

Referring to FIG. 5B, the conductive sidewall 510 may be provided. According to an embodiment, the conductive sidewall 510 may include the conductive member 512 that is disposed to be spaced a specified distance apart from the conductive sidewall 510 through the connecting part 511. According to an embodiment, the conductive sidewall 510, the connecting part 511, and the conductive member 512 may be integrally formed with each other. According to an embodiment, the conductive sidewall 510 may be formed through a process, such as injection molding, die-casting, etc.

According to various embodiments, the housing 500 may be manufactured by coupling the non-conductive member 520 made of a synthetic resin to the conductive sidewall 510 through double injection molding. According to an embodiment, the non-conductive member 520 may also be coupled with the conductive sidewall 510 through insert molding. According to an embodiment, the non-conductive member 520 may also be coupled with the conductive sidewall 510 through a structural shape. Then, the filling or coating areas 521 and 513 to which the conductive structure 540 is to be applied may be formed from the second surface 5202 of the non-conductive member 520 to the conductive member 512 of the conductive sidewall 510. According to an embodiment, the through-hole 521 may be formed from the second surface of the non-conductive member 520 to the second surface 5122 of the conductive member 512, and the bore 513 may be formed lengthwise in the conductive member 512, which is exposed through the through-hole 521, so as to be connected with the through-hole 521. However, without being limited thereto, the bore 513 of the conductive member 512 may be formed by forming the bore 513 first when forming the conductive sidewall 510, coupling the non-conductive member 520 to the conductive sidewall 510 through double injection molding, and then removing the non-conductive member 520 filling the bore 513. Thereafter, the conductive pattern 530 may be formed from the second surface 5202 of the non-conductive member 520 to at least one area of the through-hole 521, and the bore 513 and the through-hole 521 may be filled or coated with the conductive structure 540 in order to electrically connect the conductive pattern 530 and the conductive member 512.

According to various embodiments, the conductive pattern 530 extends to the at least one area of the through-hole 521, and the conductive structure 540, which is provided in order to electrically connect the conductive member 512 of the conductive sidewall 510 and the conductive pattern 530, is formed of a viscous material, which makes it possible to prevent the crack of the conductive pattern 530, which may be formed by an external impact in the boundary area between the members made of heterogeneous materials, and to effectively maintain the electrical connection between the conductive pattern 530 and the conductive member 512 through the conductive structure 540 even though the crack of the conductive pattern happens.

Figure 6A:
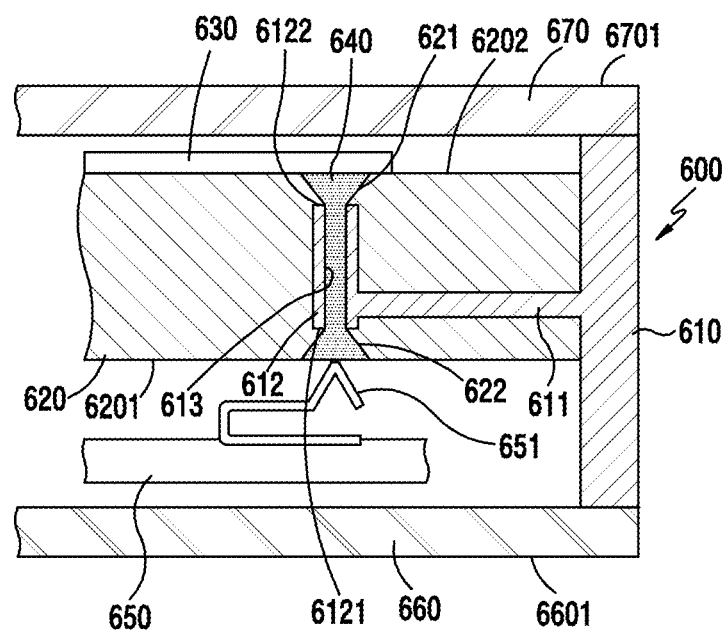
FIGS. 6A and 6B are diagrams illustrating an example configuration for electrically connecting a conductive sidewall and a conductive pattern according to various example embodiments of the present disclosure.
Figure 6B:
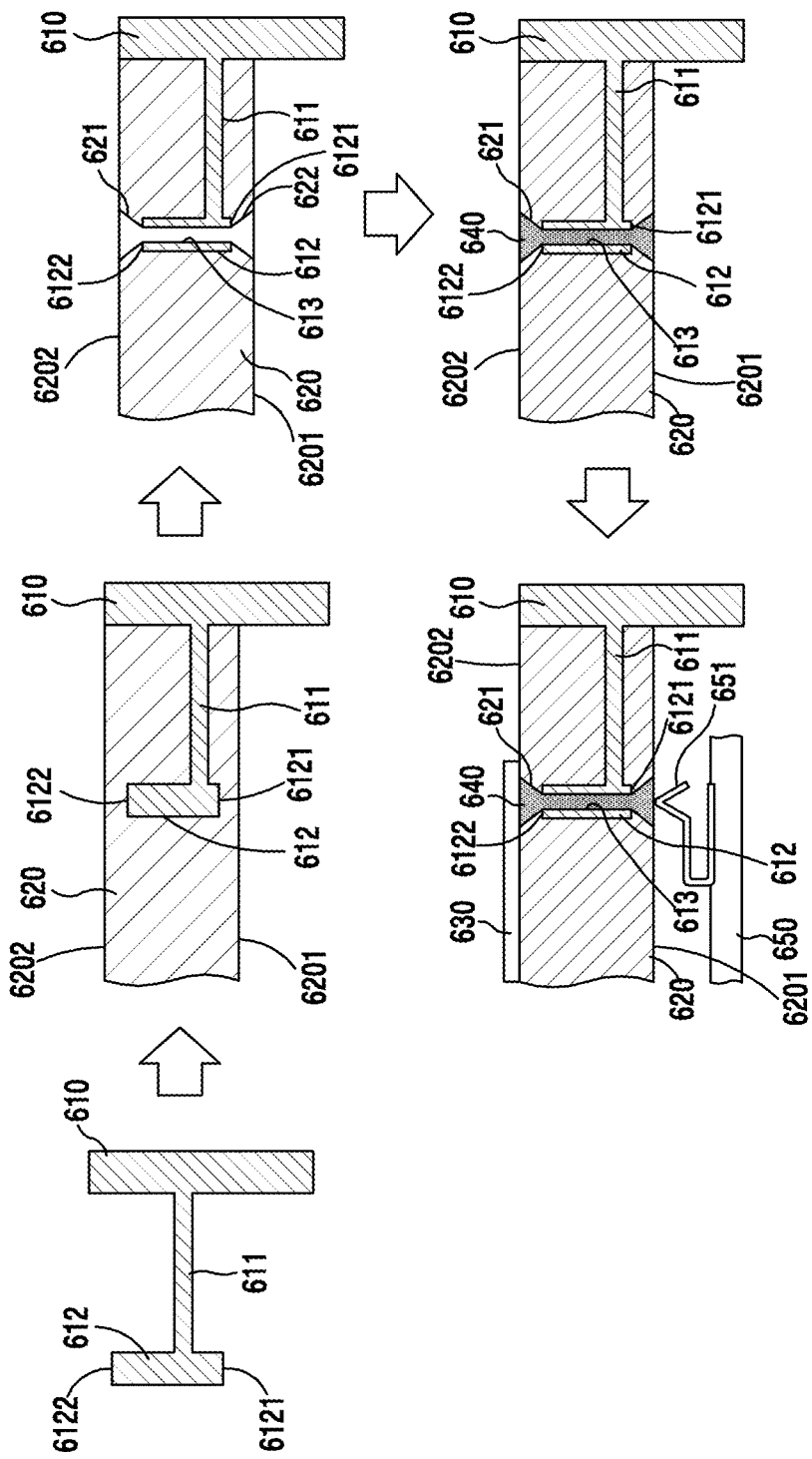

FIGS. 6A and 6B are diagrams illustrating an example configuration for electrically connecting a conductive sidewall and a conductive pattern according to various example embodiments of the present disclosure.

The conductive sidewall 610 of FIGS. 6A and 6B is an embodiment of a conductive sidewall that is similar to, or different from, the conductive sidewall 310 of FIG. 3A.

Referring to FIG. 6A, an electronic device may include a first cover 660 that forms a first surface 6601 and a second cover 670 that is opposite to the first surface 6601 of the first cover 660 and forms a second surface 6701 of the electronic device. According to an embodiment, a housing 600 may be disposed around or to surround at least a part of the space formed between the first cover 660 and the second cover 670. According to an embodiment, the housing 600 may be formed by combining heterogeneous materials. According to an embodiment, the housing 600 may include: the conductive sidewall 610; and a non-conductive member 620 made of a synthetic resin, which is formed on the conductive sidewall 610 through double injection molding. According to an embodiment, the conductive sidewall 610 may be disposed to be exposed through one area (e.g., metal bezel, etc.) of the external appearance of the electronic device. According to an embodiment, the conductive sidewall 610 may also serve as a metal structure (e.g., a metal bushing, a reinforcing piece, etc.) within the electronic device.

According to various embodiments, the conductive sidewall 610 may include a conductive member 612 that is connected thereto through a connecting part 611. According to an embodiment, the conductive member 612 may be disposed so as to not be exposed to the outside from the inside of the non-conductive member 620. According to an embodiment, first and second surfaces 6121 and 6122 of the conductive member 612 may not be exposed through first and second surfaces 6201 and 6202 of the non-conductive member 620, and the conductive member 612 may have a bore 613 formed therein lengthwise. According to an embodiment, the bore 613 may be filled or coated with a conductive structure 640 to be described below such that the conductive structure 640 may serve to electrically connect the conductive member 612 with the conductive pattern 630.

According to various embodiments, the non-conductive member 620 may have: a first through-hole 622 that is formed from the first surface 6201 of the non-conductive member 620 to the first surface 6121 of the conductive member 612: and a second through-hole 621 that is formed from the second surface 6202 of the non-conductive member 620 to the second surface 6122 of the conductive member 612. According to an embodiment, the first and second through-holes 622 and 621 may be formed to communicate with the bore 613 of the conductive member 612.

According to various embodiments, through the pair of through-holes 621 and 622, the bore 613 may be filled or coated with the conductive structure (material) 640. According to an embodiment, the bore 613, which is formed in the first surface 6121 of the conductive member 612 of the conductive sidewall 610, may be filled or coated with the conductive structure 640 through the first through-hole 622 of the non-conductive member 620. Further, according to an embodiment, the bore 613, which is formed in the second surface 6122 of the conductive member 612 of the conductive sidewall 610, may be filled or coated with the conductive structure 640 through the second through-hole 621 of the non-conductive member 620. According to an embodiment, the conductive structure 640 may be applied to a height that is the same as, or slightly higher than, those of the first and second surfaces 6201 and 6202 of the non-conductive member 620.

According to various embodiments, the conductive member 640, which is exposed through the first through-hole 622 and the first surface 6201 of the non-conductive member 620, may be electrically connected with a printed circuit board 650 through a physical contact with a connecting member 651 (e.g., a C-clip, a metal spring, a conductive tape, etc.) that is disposed on the printed circuit board 650. According to an embodiment, the connecting member 651 may include a C-clip or a metal spring, which is mounted on the printed circuit board 650. According to an embodiment, the connecting member 651 may include a conductive tape with a specified thickness, which is attached to the printed circuit board 650.

According to various embodiments, the conductive pattern 630 may be formed on at least one area of the second surface 6202 of the non-conductive member 620. According to an embodiment, the conductive pattern 630 may be a Direct Printed Antenna (DPA) that is disposed on the second surface 6202 of the non-conductive member 620. According to an embodiment, the conductive pattern 630 may be used as an antenna radiator by forming a conductive layer on at least one area of the second surface 6202 of the non-conductive member through a process, such as printing, plating, painting, etc. According to an embodiment, the conductive pattern 630 may extend to at least one area of the second through-hole 621 that is formed in the second surface 6202 of the non-conductive member 620. Accordingly, the conductive pattern 630 may be electrically connected to the printed circuit board 650 through the conductive structure 640 and the connecting member 651. According to an embodiment, the first through-hole 622 may be formed in a funnel shape that has a gradually increasing diameter toward the first surface 6201 of the non-conductive member 620 in order to increase the electrical contact area between the conductive structure 640 and the connecting member 651 to the maximum. According to an embodiment, the second through-hole 621 may be formed in a funnel shape that has a gradually increasing diameter toward the second surface 6202 of the non-conductive member 620 in order to increase the electrical contact area between the conductive pattern 630 and the conductive structure 640 to the maximum. According to an embodiment, a conductive epoxy resin with viscosity, a conductive ink, a polymer, a conductive material dispersed in the polymer, or the like may be used as the conductive structure 640. According to an embodiment, the conductive epoxy resin may be obtained by mixing conductive particles or powder with a viscous thermoplastic resin so as to make a non-conductive epoxy resin conductive.

According to various embodiments, although the conductive sidewall 610 and the conductive pattern 630 are used as an antenna radiator while being electrically connected with each other, the conductive pattern 630 may be used as an independent antenna radiator when the conductive member 612 is separated and insulated from the conductive sidewall 610 (for example, in the case of a metal island). However, without being limited thereto, the conductive sidewall 610 and the conductive pattern 630 may perform a coupling operation to serve as a parasitic antenna radiator for each other even though the conductive member 612 is separated and insulated from the conductive sidewall 610. According to an embodiment, if the conductive member 612 is formed of a non-conductive material, the conductive member may be electrically insulated from the conductive sidewall 610, and a crack may be prevented by the conductive sidewall 610.

Referring to FIG. 6B, the conductive sidewall 610 may be provided. According to an embodiment, the conductive sidewall 610 may include the conductive member 612 that is disposed to be spaced a specified distance apart from the conductive sidewall 610 through the connecting part 611. According to an embodiment, the conductive sidewall 610, the connecting part 611, and the conductive member 612 may be integrally formed with each other. According to an embodiment, the conductive sidewall 610 may be formed through a process, such as injection molding, die-casting, etc.

According to various embodiments, the housing 600 may be manufactured by coupling the non-conductive member 620 made of a synthetic resin to the conductive sidewall 610 through double injection molding. According to an embodiment, the non-conductive member 620 may also be coupled with the conductive sidewall 610 through insert molding. According to an embodiment, the non-conductive member 620 may also be coupled with the conductive sidewall 610 through a structural shape. According to an embodiment, the conductive member 612 may include the first surface 6121 and the second surface 6122 that is opposite to the first surface 6121. According to an embodiment, the non-conductive member 620 may include the first surface 6201 and the second surface 6202 that is opposite to the first surface 6201. According to an embodiment, the first and second surfaces 6121 and 6122 of the conductive member 612 may be disposed in the interior of the non-conductive member 620 so as to not be exposed through the first and second surfaces 6201 and 6202 of the non-conductive member 620.

According to various embodiments, the first through-hole 622 may be formed from the first surface 6201 of the non-conductive member 620 to the first surface 6121 of the conductive member 612. According to various embodiments, the second through-hole 621 may be formed from the second surface 6202 of the non-conductive member 620 to the second surface 6122 of the conductive member 612. According to an embodiment, the conductive member 612 may have the bore 613 formed therein lengthwise. However, without being limited thereto, the bore 613 of the conductive member 612 may be formed by coupling the conductive sidewall 610 and the non-conductive member 620 through double injection molding, and then removing a part of the non-conductive member 620 filling the bore 613. Thereafter, the first through-hole 622 of the non-conductive member 620, the bore 613 of the conductive member 612, and the second through-hole 621 of the non-conductive member 620 may be filled or coated with the conductive structure 640. According to an embodiment, the conductive pattern 630 may be disposed to cover the conductive structure 640 that is exposed through the second surface 6202 of the non-conductive member 620.

According to various embodiments, the conductive structure 640, which is provided in order to electrically connect the conductive member 612 of the conductive sidewall 610 and the conductive pattern 630, may be formed of a viscous material, which makes it possible to prevent the crack of the conductive pattern 630, which may be formed by an external impact in the boundary area between the members made of heterogeneous materials, and to effectively maintain the electrical connection between the conductive pattern 630 and the conductive member 612 through the conductive structure 640 even though the crack of the conductive pattern happens.

Figure 7:
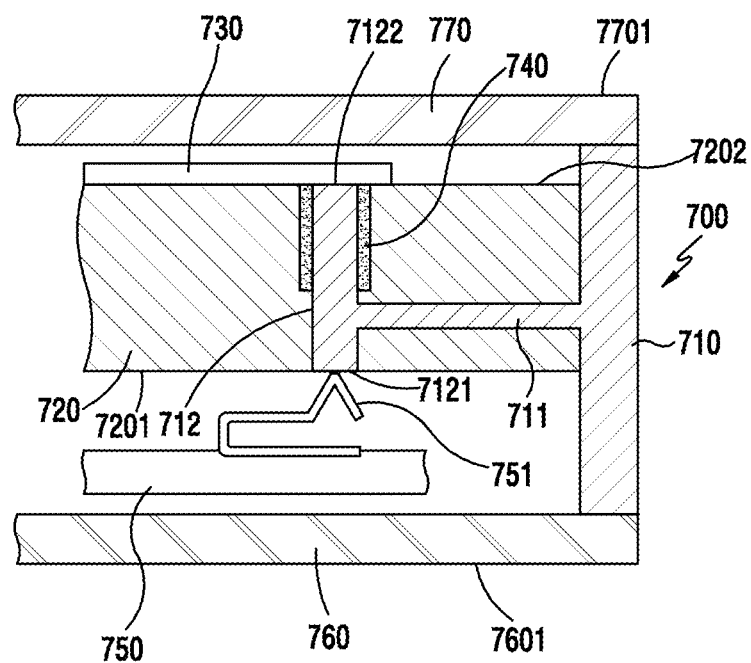
FIG. 7 is a diagram illustrating an example configuration for electrically connecting a conductive sidewall and a conductive pattern according to various example embodiments of the present disclosure.

FIG. 7 is a diagram illustrating an example configuration for electrically connecting a conductive sidewall and a conductive pattern according to various example embodiments of the present disclosure.

The conductive sidewall 710 of FIG. 7 is an embodiment of a conductive sidewall that is similar to, or different from, the conductive sidewall 310 of FIG. 3A.

Referring to FIG. 7, an electronic device may include a first cover 760 that forms a first surface 7601 and a second cover 770 that is opposite to the first surface 7601 of the first cover 760 and forms a second surface 7701 of the electronic device. According to an embodiment, a housing 700 may be disposed around or to surround at least a part of the space formed between the first cover 760 and the second cover 770. According to an embodiment, the housing 700 may be formed by combining heterogeneous materials through double injection molding. According to an embodiment, the housing 700 may include: the conductive sidewall 710; and a non-conductive member 720 made of a synthetic resin, which is formed on the conductive sidewall 710 through double injection molding. According to an embodiment, the conductive sidewall 710 may be disposed to be exposed through one area (e.g., metal bezel, etc.) of the external appearance of the electronic device. According to an embodiment, the conductive sidewall 710 may also serve as a metal structure (e.g., a metal bushing, a reinforcing piece, etc.) within the electronic device. According to an embodiment, the non-conductive member 720 may also be coupled with the conductive sidewall 710 through insert molding. According to an embodiment, the non-conductive member 720 may also be coupled with the conductive sidewall 710 through a structural shape.

According to various embodiments, the conductive sidewall 710 may include a conductive member 712 that is connected thereto through a connecting part 711. According to an embodiment, a first surface 7121 of the conductive member 712 may be disposed to be exposed through a first surface 7201 of the non-conductive member 720. According to an embodiment, a second surface 7122 that is opposite to the first surface 7121 of the conductive member 712 may also be disposed to be exposed through a second surface 7202 of the non-conductive member 720, which is opposite to the first surface 7201. According to an embodiment, the first surface 7121 of the conductive member 712, which is exposed through the first surface 7201 of the non-conductive member 720, may be electrically connected with a printed circuit board 750 through a physical contact with a connecting member 751 (e.g., a C-clip, a metal spring, a conductive tape, etc.) that is disposed on the printed circuit board 750. According to an embodiment, the connecting member 751 may include a C-clip or a metal spring, which is mounted on the printed circuit board 750. According to an embodiment, the connecting member 751 may include a conductive tape with a specified thickness, which is attached to the printed circuit board 750.

According to various embodiments, the conductive pattern 730 may be disposed in an area that includes the conductive member 712 that is exposed through the second surface 7202 of the non-conductive member 720. According to an embodiment, the conductive pattern 730 may be a Direct Printed Antenna (DPA) that is disposed on at least one area of the second surface 7202 of the non-conductive member 720. According to an embodiment, the conductive pattern 730 may be used as an antenna radiator by forming a conductive layer on at least one area of the second surface 7202 of the non-conductive member through a process, such as printing, plating, painting, etc. According to an embodiment, the conductive pattern 730 may be electrically connected to the printed circuit board 750 through the conductive member 712 and the connecting member 751.

A buffer member 740 may be additionally provided along the outer circumferential surface of the conductive member 712 before the conductive sidewall 710 and the non-conductive member 720 are coupled with each other. According to an embodiment, the buffer member 740 may include an adhesive resin for injection molding, which is coated along the outer circumferential surface of the conductive member 712. According to an embodiment, when the conductive member 712 having the buffer member 740 applied thereto and the non-conductive member 720 are coupled with each other through a process, such as double injection molding, etc., even through an external impact is applied to the electronic device, the buffer member 740 can absorb the impact, and it is possible to prevent, in advance, a crack from being generated in the conductive pattern that is disposed on the boundary between the two members 712 and 720.

According to various embodiments, the conductive sidewall 710 may be provided. According to an embodiment, the conductive sidewall 710 may include the conductive member 712 that is disposed to be spaced a specified distance apart from the conductive sidewall 710 through the connecting part 711. According to an embodiment, the conductive sidewall 710, the connecting part 711, and the conductive member 712 may be integrally formed with each other. According to an embodiment, the conductive sidewall 710 may be formed through a process, such as injection molding, die-casting, etc.

According to various embodiments, the buffer member 740 may be disposed to the position corresponding to the second surface 7202 of the non-conductive member 720 along the outer circumferential surface of the conductive member 712. According to an embodiment, the buffer member 740 may have a specified thickness and length. According to an embodiment, the conductive member 712 on which the buffer member 740 is disposed and the non-conductive member may be coupled with each other.

According to various embodiments, the housing 700 may be manufactured by coupling the non-conductive member 720 made of a synthetic resin to the conductive sidewall 710 through double injection molding. According to an embodiment, the non-conductive member 720 may also be coupled with the conductive sidewall 710 through insert molding. According to an embodiment, the non-conductive member 720 may also be coupled with the conductive sidewall 710 through a structural shape.

According to various embodiments, the conductive pattern 730 may be formed in at least one area that includes the second surface 7122 of the conductive member 712, which is exposed through the second surface 7202 of the non-conductive member 720. According to an embodiment, the conductive pattern 730 may be electrically connected to the printed circuit board 750 through the conductive member 712 and the connecting member 751. According to an embodiment, even though an external impact is applied to the electronic device, the buffer member 740 can absorb the impact, and it is possible to prevent, in advance, a crack from being generated in the conductive pattern that is disposed on the boundary between the conductive member 712 and the non-conductive member 720.

Figure 8:
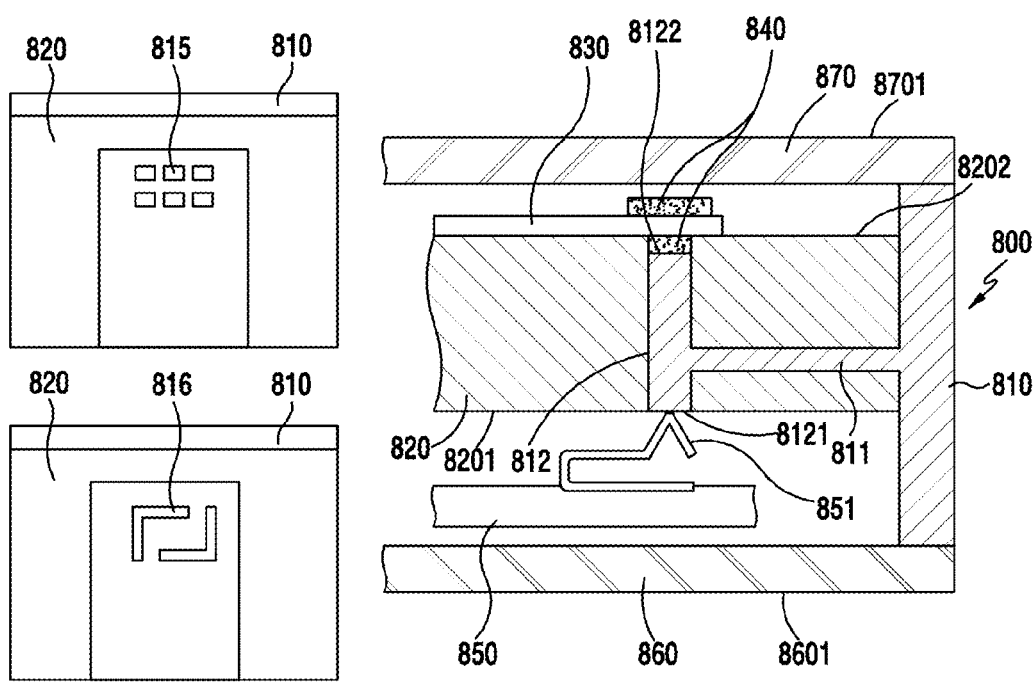
FIG. 8 is a diagram illustrating an example configuration for electrically connecting a conductive sidewall and a conductive pattern according to various example embodiments of the present disclosure.

FIG. 8 is a diagram illustrating an example configuration for electrically connecting a conductive sidewall 810 and a conductive pattern 830 according to various example embodiments of the present disclosure.

The conductive sidewall 810 of FIG. 8 is an embodiment of a conductive sidewall that is similar to, or different from, the conductive sidewall 310 of FIG. 3A.

Referring to FIG. 8, an electronic device may include a first cover 860 that forms a first surface 8601 and a second cover 870 that is opposite to the first surface 8601 of the first cover 860 and forms a second surface 8701 of the electronic device. According to an embodiment, a housing 800 may be disposed around or to surround at least a part of the space formed between the first cover 860 and the second cover 870. According to an embodiment, the housing 800 may be formed by combining heterogeneous materials through double injection molding. According to an embodiment, the housing 800 may include: the conductive sidewall 810; and a non-conductive member 820 made of a synthetic resin, which is formed on the conductive sidewall 810 through double injection molding. According to an embodiment, the conductive sidewall 810 may be disposed to be exposed through one area (e.g., metal bezel, etc.) of the external appearance of the electronic device. According to an embodiment, the conductive sidewall 810 may also serve as a metal structure (e.g., a metal bushing, a reinforcing piece, etc.) within the electronic device. According to an embodiment, the non-conductive member 820 may also be coupled with the conductive sidewall 810 through insert molding. According to an embodiment, the non-conductive member 820 may also be coupled with the conductive sidewall 810 through a structural shape.

According to various embodiments, the conductive sidewall 810 may include a conductive member 812 that is connected thereto through a connecting part 812. According to an embodiment, a first surface 8121 of the conductive member 812 may be disposed to be exposed through a first surface 8201 of the non-conductive member 820. According to an embodiment, a second surface 8122 that is opposite to the first surface 8121 of the conductive member 812 may be disposed so as to not be exposed through a second surface 8202 that is opposite to the first surface 8201 of the non-conductive member 820. According to an embodiment, the first surface 8121 of the conductive member 812, which is exposed through the bottom surface of the non-conductive member 820, may be electrically connected with a printed circuit board 850 through a physical contact with a connecting member 851 (e.g., a C-clip, a metal spring, a conductive tape, etc.) that is disposed on the printed circuit board 850. According to an embodiment, the connecting member 851 may include a C-clip or a metal spring, which is mounted on the printed circuit board 850. According to an embodiment, the connecting member 851 may include a conductive tape with a specified thickness, which is attached to the printed circuit board 850.

According to various embodiments, the conductive pattern 830 may be disposed in at least one area that includes the area where the second surface 8202 of the non-conductive member 820 overlaps the conductive member 812. According to an embodiment, the conductive pattern 830 may be a Direct Printed Antenna (DPA) that is disposed on the second surface 8202 of the non-conductive member 820. According to an embodiment, the conductive pattern 830 may be used as an antenna radiator by forming a conductive layer on at least one area of the second surface 8202 of the non-conductive member through a process, such as printing, plating, painting, etc.

According to various embodiments, a conductive structure 840 may be additionally disposed between the conductive member 812 and the conductive pattern 830 and/or on the conductive pattern 830. According to an embodiment, the conductive structure 840 may be a conductive epoxy resin, a conductive ink, a polymer, or a conductive material dispersed in the polymer. According to an embodiment, the conductive epoxy resin may be obtained by mixing conductive particles or powder with a viscous thermoplastic resin so as to make a non-conductive epoxy resin conductive. According to an embodiment, the contact points between the conductive member 812 and the conductive structure 840 may include a plurality of unit patterns 815, 816 that are formed periodically or bilaterally symmetric. According to an embodiment, the various forms of unit patterns 815, 816, which are formed on the conductive pattern 830, may be filled or coated with the conductive structure 840. Even though an external impact is applied to the electronic device, the electrical connection between the conductive member 812 and the conductive pattern 830 may be consistently maintained through the shapes of the unit patterns 815, 816 and the conductive structure 840 with which the unit patterns 815, 816 are filled or coated.

According to various embodiments, the conductive sidewall 810 may be provided. According to an embodiment, the conductive sidewall 810 may include the conductive member 812 that is disposed to be spaced a specified distance apart from the conductive sidewall 812 through the connecting part 811. According to an embodiment, the conductive sidewall 810, the connecting part 811, and the conductive member 812 may be integrally formed with each other. According to an embodiment, the conductive sidewall 810 may be formed through a process, such as injection molding, die-casting, etc.

According to various embodiments, the housing 800 may be manufactured by coupling the non-conductive member 820 made of a synthetic resin to the conductive sidewall 810 through double injection molding. According to an embodiment, the non-conductive member 820 may also be coupled with the conductive sidewall 810 through insert molding. According to an embodiment, the non-conductive member 820 may also be coupled with the conductive sidewall 810 through a structural shape.

According to various embodiments, the conductive pattern 830 may be formed in at least one area that includes the second surface 8122 of the conductive member 812, which is exposed through the second surface 8202 of the non-conductive member 820. According to an embodiment, the conductive pattern 830 may be electrically connected to the printed circuit board 850 through the conductive member 812 and the connecting member 851. According to an embodiment, the one or more unit patterns 815, 816 may be formed in the area of the conductive pattern 830 that overlaps the conductive member 812. According to an embodiment, the conductive structure 840 may be disposed between the conductive pattern 830 and the conductive member 812 and/or on the conductive pattern 830. According to an embodiment, the area that includes the unit patterns 815, 816 may be filled or coated with the conductive structure 840. According to an embodiment, the area that includes at least the second surface 8122 of the conductive member 812 may be filled or coated with the conductive structure 840. According to an embodiment, even though an external impact is applied to the electronic device, the electrical connection between the conductive member 812 and the conductive pattern 830 may be consistently maintained through the shapes of the unit patterns 815, 816, which are formed on the conductive pattern 830, and the conductive structure 840 with which the unit patterns 815, 816 are filled or coated.

Figure 9A:
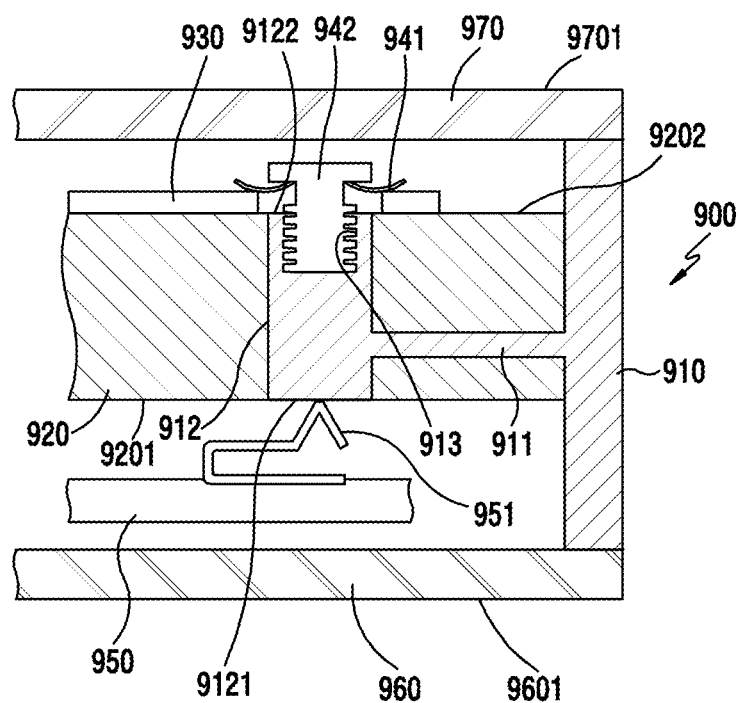
FIGS. 9A and 9B are diagrams illustrating an example configuration for electrically connecting a conductive sidewall and a conductive pattern according to various example embodiments of the present disclosure.
Figure 9B:
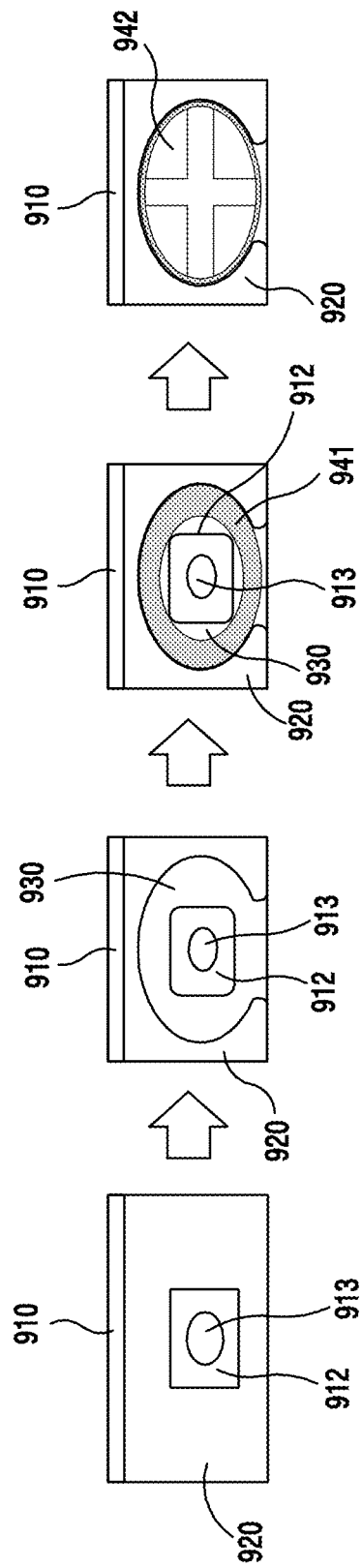

FIGS. 9A and 9B are diagrams illustrating an example configuration for electrically connecting a conductive sidewall 910 and a conductive pattern 930 according to various example embodiments of the present disclosure.

The conductive sidewall 910 of FIGS. 9A and 9B is an embodiment of a conductive sidewall that is similar to, or different from, the conductive sidewall 310 of FIG. 3A.

Referring to FIGS. 9A and 9B, an electronic device may include a first cover 960 that forms a first surface 9601 and a second cover 970 that is opposite to the first surface 9601 of the first cover 960 and forms a second surface 9701 of the electronic device. According to an embodiment, a housing 900 may be disposed around or to surround at least a part of the space formed between the first cover 960 and the second cover 970. According to an embodiment, the housing 900 may be formed by combining heterogeneous materials through double injection molding. According to an embodiment, the housing 900 may include: the conductive sidewall 910; and a non-conductive member 920 made of a synthetic resin, which is formed on the conductive sidewall 910 through double injection molding. According to an embodiment, the conductive sidewall 910 may be disposed to be exposed through one area (e.g., metal bezel, etc.) of the external appearance of the electronic device. According to an embodiment, the conductive sidewall 910 may also serve as a metal structure (e.g., a metal bushing, a reinforcing piece, etc.) within the electronic device. According to an embodiment, the non-conductive member 920 may also be coupled with the conductive sidewall 910 through insert molding. According to an embodiment, the non-conductive member 920 may also be coupled with the conductive sidewall 910 through a structural shape.

According to various embodiments, the conductive sidewall 910 may include a conductive member 912 that is connected thereto through a connecting part 911. According to an embodiment, a first surface 9121 of the conductive member 912 may be disposed to be exposed through a first surface 9201 of the non-conductive member 920. According to an embodiment, a second surface 9122 that is opposite to the first surface 9121 of the conductive member 912 may also be disposed to be exposed through a second surface 9202 of the non-conductive member 920, which is opposite to the first surface 9201. According to an embodiment, the first surface 8121 of the conductive member 912, which is exposed through the bottom surface of the non-conductive member 920, may be electrically connected with a printed circuit board 950 through a physical contact with a connecting member 951 (e.g., a C-clip, a metal spring, a conductive tape, etc.) that is disposed on the printed circuit board 950. According to an embodiment, the connecting member 951 may include a C-clip or a metal spring, which is mounted on the printed circuit board 950. According to an embodiment, the connecting member 951 may include a conductive tape with a specified thickness, which is attached to the printed circuit board 950.

According to various embodiments, the conductive member 912 may or may not be exposed through the second surface 9202 of the non-conductive member 920, and may have a screw groove 913 formed therein. According to an embodiment, a screw 942 may be fastened to the screw groove 913 while passing through the second surface 9202 of the non-conductive member 920. According to an embodiment, the conductive pattern 930 may be formed on the second surface 9202 of the non-conductive member 920. According to an embodiment, the conductive pattern 930 may be a Direct Printed Antenna (DPA) that is disposed on the upper surface of the non-conductive member 920. According to an embodiment, the conductive pattern 930 may be used as an antenna radiator by forming a conductive layer on at least one area of the second surface 9202 of the non-conductive member 920 through a process, such as printing, plating, painting, etc.

According to various embodiments, the conductive pattern 930 may be disposed on the second surface 9202 of the non-conductive member 920 that corresponds to the outer periphery of the screw groove 913 of the conductive member 912 to which the screw 942 is fastened. According to an embodiment, a connection member 941 may be additionally interposed between the screw 942 and the conductive member 912. According to an embodiment, the connection member 941 may have a larger diameter than the screw 942, and may be disposed to make surface-to-surface contact with the conductive pattern 930, which is disposed on the upper surface of the non-conductive member 920, with a relatively large contact area therebetween. According to an embodiment, the connection member 941 may include a belleville spring, a washer, or the like, which has a through-hole formed therein through which the screw 942 passes. Accordingly, the conductive pattern 930 may be electrically connected to the printed circuit board 950 through the connection member 941, the screw 942, the conductive member 912, and the connecting member 951.

According to various embodiments, although the conductive sidewall 910 and the conductive pattern 930 are used as an antenna radiator while being electrically connected with each other, the conductive pattern 930 may be used as an independent antenna radiator when the conductive member 912 is separated and insulated from the conductive sidewall 910 (for example, in the case of a metal island). However, without being limited thereto, the conductive sidewall 910 and the conductive pattern 930 may perform a coupling operation to serve as a parasitic antenna radiator for each other even though the conductive member 912 is separated and insulated from the conductive sidewall 910.

Figure 10A:
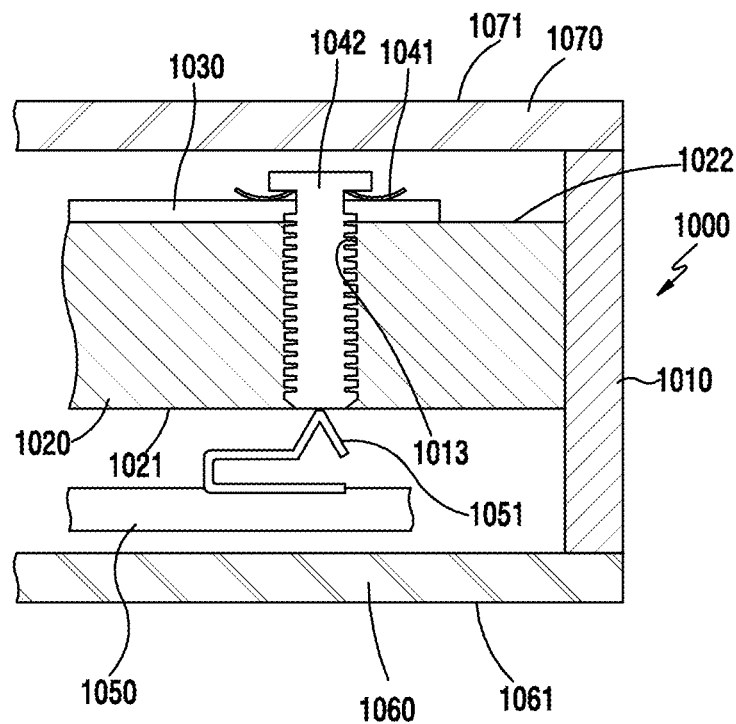
FIGS. 10A and 10B are diagrams illustrating an example configuration for electrically connecting a conductive pattern to a printed circuit board according to various example embodiments of the present disclosure.
Figure 10B:
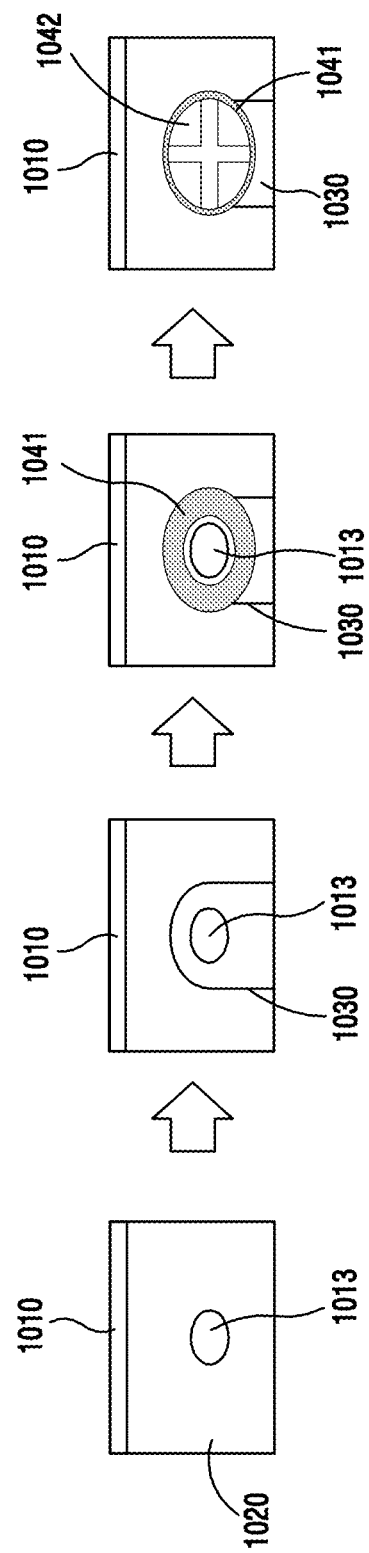

FIGS. 10A and 10B are diagrams illustrating an example configuration for electrically connecting a conductive pattern 1030 to printed circuit board 1050 according to various example embodiments of the present disclosure.

Referring to FIGS. 10A and 10B, an electronic device may include a first cover 1060 that forms a first surface 1061 and a second cover 1070 that is opposite to the first surface 1061 of the first cover 1060 and forms a second surface 1071 of the electronic device. According to an embodiment, a housing 1000 may be disposed around or to surround at least a part of the space formed between the first cover 1060 and the second cover 1070. According to an embodiment, the housing 1000 may be formed by combining heterogeneous materials through double injection molding. According to an embodiment, the housing 1000 may include: a conductive sidewall 1010; and a non-conductive member 1020 made of a synthetic resin, which is formed on the conductive sidewall 1010 through double injection molding. According to an embodiment, the conductive sidewall 1010 may be disposed to be exposed through one area (e.g., metal bezel, etc.) of the external appearance of the electronic device. According to an embodiment, the conductive sidewall 1010 may also serve as a metal structure (e.g., a metal bushing, a reinforcing piece, etc.) within the electronic device. According to an embodiment, the non-conductive member 1020 may also be coupled with the conductive sidewall 1010 through insert molding. According to an embodiment, the non-conductive member 1020 may also be coupled with the conductive sidewall 1010 through a structural shape.

According to various embodiments, a configuration for independently electrically connecting the conductive pattern 1030, which is disposed on a second surface 1022 of the non-conductive member 1020, to the printed circuit board 1050 is illustrated, as opposed to the above-described embodiments. According to an embodiment, a screw hole 1013 may be formed in the non-conductive member 1020. According to an embodiment, the screw hole 1013 may be formed through the non-conductive member 1020 from the second surface 1022 to the first surface 1021 of the non-conductive member 1020. According to an embodiment, the conductive pattern 1030 may be disposed around the screw hole 1013 in the second surface 1022 of the non-conductive member 1020. According to an embodiment, the conductive pattern 1030 may be a Direct Printed Antenna (DPA) that is disposed on the second surface 1022 of the non-conductive member 1020. According to an embodiment, the conductive pattern 1030 may be used as an antenna radiator by forming a conductive layer on at least one area of the second surface 1022 of the non-conductive member 1020 through a process, such as printing, plating, painting, etc.

According to various embodiments, the conductive pattern 1030 may extend to the vicinity of the screw hole 1013 in the second surface 1022 of the non-conductive member 1020. According to an embodiment, a screw 1042 may be fastened to the screw hole 1013 of the non-conductive member 1020. For example, a connection member 1041 may be additionally interposed between the screw 1042 and the non-conductive member 1020. According to an embodiment, the connection member 1041 may have a larger diameter than the screw 1042, and may be disposed to make surface-to-surface contact with the conductive pattern 1030, which is disposed on the second surface 1022 of the non-conductive member 1020, with a relatively large contact area therebetween. According to an embodiment, the connection member 1041 may include a belleville spring, a washer, or the like, which has a through-hole formed therein through which the screw 1042 passes. According to an embodiment, the distal end portion of the screw 1042 may be disposed to be exposed through the bottom surface of the non-conductive member 1020. The exposed end portion of the screw 1042 may be electrically connected with the printed circuit board 1050 through a physical contact with a connecting member 1051 (e.g., a C-clip, a metal spring, etc.) that is disposed on the printed circuit board 1050. Accordingly, the conductive pattern 1030 may be electrically connected to the printed circuit board 1050 through the connection member 1041, the screw 1042, and the connecting member 1051.

According to various embodiments, the conductive pattern 1030 is electrically connected with the printed circuit board 1050 through the screw 1042 and the connecting member 1051 so that the conductive pattern 1030 may be independently used as an antenna radiator. However, without being limited thereto, the conductive pattern 1030 may be disposed in a position where the conductive pattern can be coupled with the conductive sidewall 1010, and the conductive sidewall 1010 may be used as an additional antenna radiator.

Figure 11A:
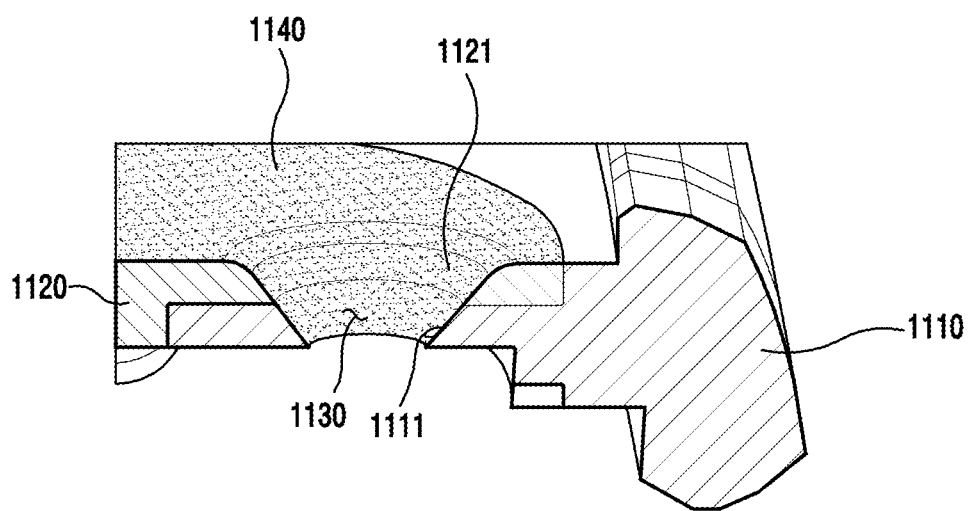
FIGS. 11A to 11C are diagrams illustrating example shapes of receiving spaces that are provided in non-conductive members and conductive sidewalls in order to receive conductive structures, according to various example embodiments of the present disclosure.
Figure 11B:
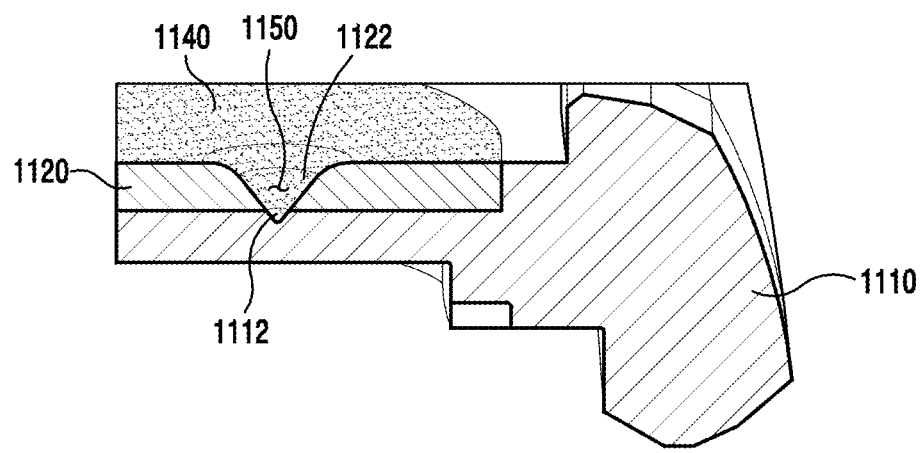
Figure 11C:
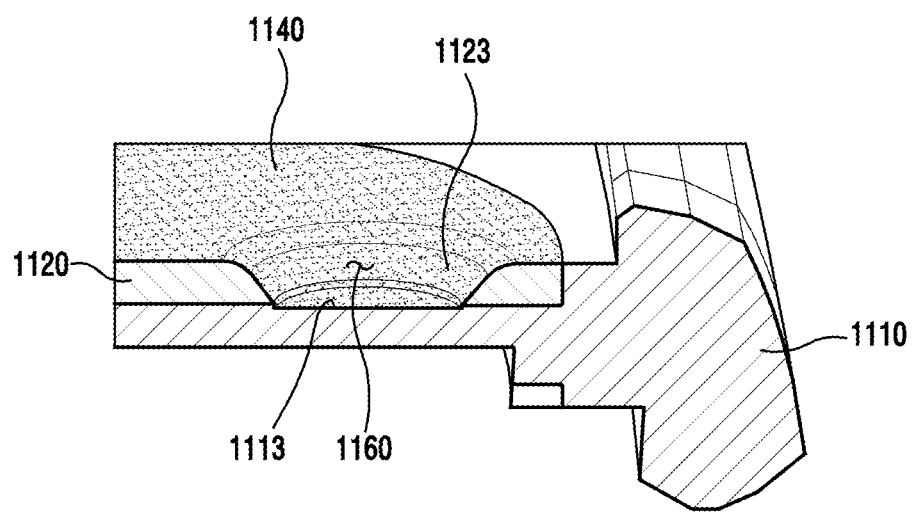

FIGS. 11A to 11C are diagrams illustrating example shapes of receiving spaces 1130, 1150, and 1160 that are provided in conductive members 1110 and non-conductive members 1120 in order to receive conductive structures, according to various example embodiments of the present disclosure.

The conductive members 1110 of FIGS. 11A to 11C are embodiments of a conductive member that is similar to, or different from, the conductive sidewall 310 of FIG. 3A.

Referring to FIGS. 11A to 11C, the conductive member 1110 and the non-conductive member 1120 may be coupled with each other through double injection molding to form a single housing. According to an embodiment, the conductive member 1110 may be disposed to be exposed through one area (e.g., metal bezel, etc.) of the external appearance of the electronic device. According to an embodiment, the conductive member 1110 may also serve as a metal structure (e.g., a metal bushing, a reinforcing piece, etc.) within the electronic device. According to an embodiment, the non-conductive member 1020 may also be coupled with the conductive member 1110 through insert molding. According to an embodiment, the non-conductive member 1020 may also be coupled with the conductive member 1110 through a structural shape.

According to various embodiments, the receiving space 1130, 1150, or 1160 is illustrated, which is formed through the conductive member 1110 and the non-conductive member 1120 and is filled or coated with the above-described conductive structure (e.g., a conductive epoxy resin with viscosity, a conductive ink, a polymer, a conductive material dispersed in the polymer, etc.).

Referring to FIG. 11A, the conductive member 1110 and the non-conductive member 1120 may be coupled to overlap each other. According to an embodiment, the receiving space 1130, which is filled or coated with the conductive structure, may be provided in the area where a conductive pattern 1140 is disposed in the overlapping area. According to an embodiment, the receiving space 1130 may include a first through-hole 1111 formed in the conductive member 1110 and a second through-hole 1121 formed in the non-conductive member 1120. According to an embodiment, the first and second through-holes 1111 and 1121 may be disposed to communicate with each other and may be formed in the shape of an opening that has a gradually increasing diameter toward the upper portion thereof. According to an embodiment, the receiving space 1130 may be formed through the non-conductive member 1120 and the conductive member 1110. For example, when the conductive pattern 1140 is disposed on the upper surface of the non-conductive member 1120, the conductive structure may be brought into contact with the conductive pattern 1140 over a relatively wide area, which makes it possible to prevent, in advance, the performance of the conductive pattern 1140 that is used as an antenna radiator from being degraded by a crack that is generated on the boundary between the conductive member 1110 and the non-conductive member 1120 by an external impact.

Referring to FIG. 11B, the conductive member 1110 and the non-conductive member 1120 may be coupled to overlap each other. According to an embodiment, the receiving space 1150, which is filled or coated with the conductive structure, may be provided in the area where a conductive pattern 1140 is disposed in the overlapping area. According to an embodiment, the receiving space 1150 may include a through-hole 1122 formed in the non-conductive member 1120 and a receiving recess 1112 formed in the conductive member 1110. According to an embodiment, the through-hole 1122 and the receiving recess 1112 may be disposed to communicate with each other and may be formed in a conical shape that has a gradually increasing diameter toward the upper portion thereof. According to an embodiment, the receiving space 1150 that is constituted by the through-hole 1122 and the receiving recess 1112 may be formed in a conical shape having a closed end, and may be filled or coated with the conductive structure to establish an electrical connection.

According to various embodiments, when the conductive pattern 1140 is disposed on the upper surface of the non-conductive member 1120, the conductive structure may be brought into contact with the conductive pattern over a relatively wide area, which makes it possible to prevent, in advance, the performance of the conductive pattern, which is used as an antenna radiator, from being degraded by a crack that is generated on the boundary between the conductive member 1110 and the non-conductive member 1120 by an external impact.

Referring to FIG. 11C, the conductive member 1110 and the non-conductive member 1120 may be coupled to overlap each other. According to an embodiment, the receiving space 1160, which is filled or coated with the conductive structure, may be provided in the area where a conductive pattern 1140 is disposed in the overlapping area. According to an embodiment, the receiving space 1160 may include a through-hole 1123 formed in the non-conductive member 1123 and a receiving recess 1113 formed in the conductive member 1110. According to an embodiment, the through-hole 1123 and the receiving recess 1113 may be disposed to communicate with each other and may be formed in a shape that has a gradually increasing diameter toward the upper portion thereof. According to an embodiment, the receiving space 1160 that is constituted by the through-hole 1113 and the receiving recess 1123 may be formed to have a closed end with a relatively wide area, and may be filled or coated with the conductive structure to establish an electrical connection.

According to various embodiments, when the conductive pattern 1140 is disposed on the upper surface of the non-conductive member 1120, the conductive structure may be brought into contact with the conductive pattern over a relatively wide area, which makes it possible to prevent, in advance, the performance of the conductive pattern that is used as an antenna radiator from being degraded by a crack that is generated on the boundary between the conductive member 1110 and the non-conductive member 1120 by an external impact.

Figure 12:
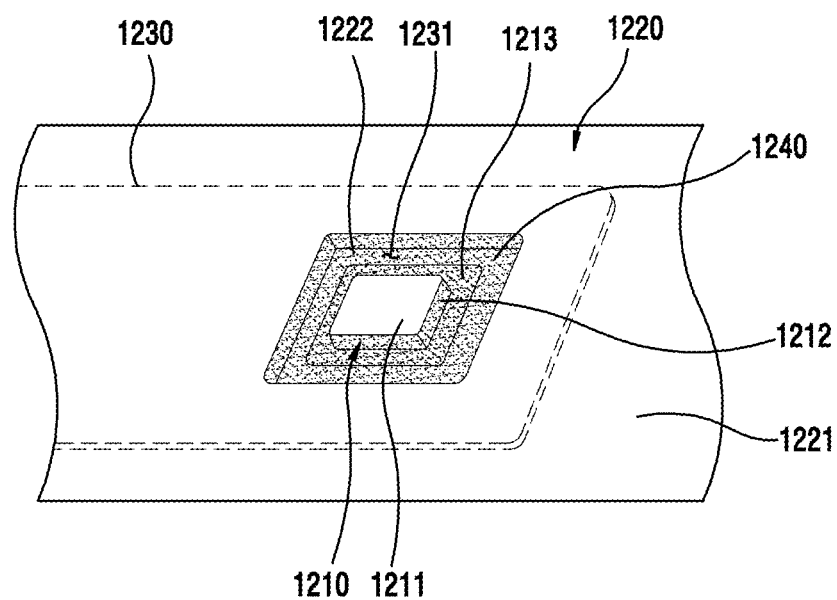
FIG. 12 is a diagram illustrating an example shape of a receiving space that is provided in a non-conductive member and a conductive sidewall in order to receive a conductive structure, according to various example embodiments of the present disclosure.

FIG. 12 is a diagram illustrating an example shape of a receiving space 1231 that is provided in a non-conductive member 1220 and a conductive member 1210 in order to receive a conductive structure 1240, according to various embodiments of the present disclosure.

The conductive member 1210 of FIG. 12 is an embodiment of a conductive member that is similar to, or different from, the conductive sidewall 310 of FIG. 3A.

Referring to FIG. 12, the conductive member 1210 and the non-conductive member 1220 may be coupled with each other through double injection molding to form a single housing. According to an embodiment, the conductive member 1210 may be disposed to be exposed through one area (e.g., metal bezel, etc.) of the external appearance of the electronic device. According to an embodiment, the conductive member 1210 may also serve as a metal structure (e.g., a metal bushing, a reinforcing piece, etc.) within the electronic device. According to an embodiment, the non-conductive member 1220 may also be coupled with the conductive member 1210 through insert molding. According to an embodiment, the non-conductive member 1220 may also be coupled with the conductive member 1210 through a structural shape.

According to various embodiments, illustrated is the receiving space 1231 that is formed through the conductive member 1210 and the non-conductive member 1220 and is filled or coated with the above-described conductive structure (e.g., a conductive epoxy resin with viscosity, a conductive ink, a polymer, a conductive material dispersed in the polymer, etc.).

Referring to FIG. 12, the conductive member 1210 and the non-conductive member 1220 may be coupled to overlap each other, and the receiving space 1231, which is filled or coated with the conductive structure 1240, may be provided in at least a part of the area where a conductive pattern 1230 is disposed in the overlapping area.

According to various embodiments, the receiving space 1231 may be formed in a recess shape having a specified depth. According to an embodiment, a first surface 1211 that is a part of the conductive member 1210 may be disposed within the receiving space 1231 so as to be exposed therethrough. According to an embodiment, the first surface of the conductive member 1210 may protrude upward within the receiving space 1231, and the conductive member 1210 may include a second surface 1212 that extends to at least the first surface 1221 of the non-conductive member 1220. According to an embodiment, the first surface 1211 of the conductive member 1210 may be formed at a height that is the same as, or lower or higher than, that of the first surface 1221 of the non-conductive member 1220.

According to various embodiments, the lower surface of the receiving space 1231 for receiving the conductive structure 1240 may include a first receiving surface 1213 that serves as one area of the conductive member 1210 and a second receiving surface 1222 that serves as one area of the non-conductive member 1220. According to an embodiment, when the receiving space 1231 is filled or coated with the conductive structure 1240, the first and second surfaces 1213 and 1222 may receive the conductive structure 1240 together. For example, the receiving space 1231 may be filled or coated with the conductive structure 1240 such that the conductive structure 1240 may include both the first receiving surface 1213 of the conductive member 1210 and the second receiving surface 1222 of the non-conductive member 1220. According to an embodiment, the receiving space 1231 may be filled or coated with the conductive structure 1240 to at least the height that corresponds to the first surface 1221 of the non-conductive member 1220, and the conductive pattern 1230 may be disposed on the conductive structure 1240.

According to various embodiments, the conductive pattern 230 may be disposed to include the first surface 1211 of the conductive member 1210 and the first surface 1221 of the non-conductive member 1220. For example, even though a crack may be generated in the portion of the conductive pattern 1230 that corresponds to the boundary between the conductive member 1210 and the non-conductive member 1220 by an external impact applied to the electronic device, the conductive pattern 1230 may continually maintain the electrical connection, thereby preventing, in advance, a degradation in the performance of the antenna device since the conductive pattern 1230 makes surface-to-surface contact with the first surface 1211 of the conductive member 1210 through the conductive structure 1240.

According to various embodiments of the present disclosure, when the conductive pattern and the conductive sidewall (e.g., conductive member) are electrically connected with each other, at least one of the various embodiments described above may be configured together.

Figure 13:
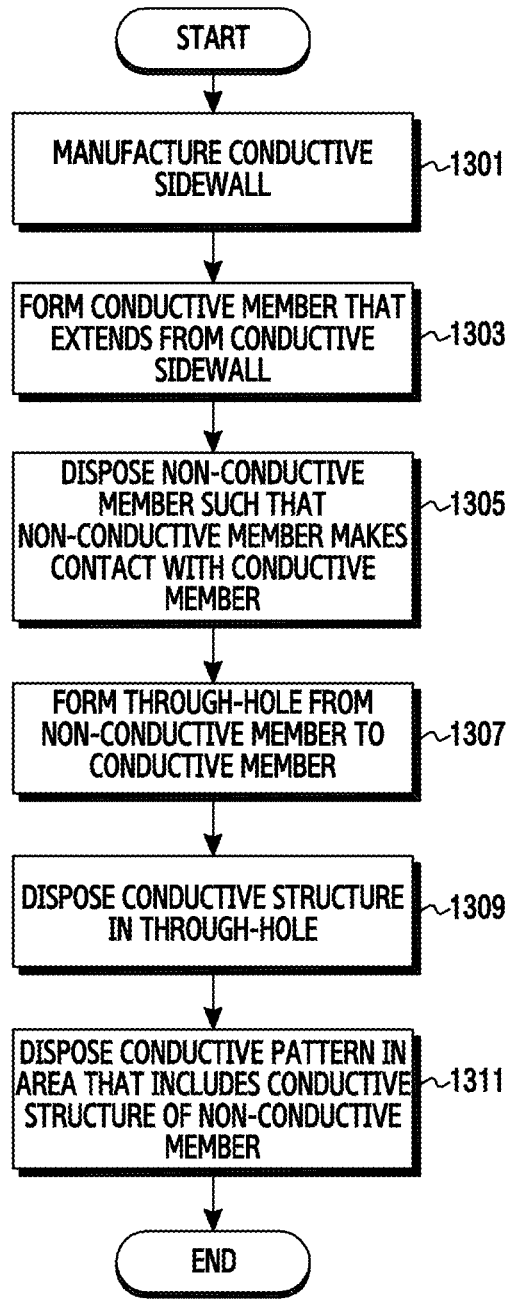
FIG. 13 is a flowchart illustrating an example procedure of disposing a conductive pattern in a housing, according to various example embodiments of the present disclosure.

FIG. 13 is a flowchart illustrating an example procedure of disposing a conductive pattern in a housing, according to various example embodiments of the present disclosure, where the procedure will be described based on FIGS. 4A to 6B.

Referring to FIG. 13, a conductive sidewall (e.g., the conductive sidewall 410 of FIG. 4A) may be manufactured in operation 1301. According to an embodiment, the conductive sidewall 410 may be disposed to be exposed through one area (e.g., metal bezel, etc.) of the external appearance of the electronic device. According to an embodiment, the conductive sidewall 410 may serve as a metal structure (e.g., a metal bushing, a reinforcing piece, etc.) within the electronic device. According to an embodiment, the conductive sidewall 410 may be formed through a process, such as injection molding, die-casting, etc.

In operation 1303, according to various embodiments, the conductive sidewall 410 may include a conductive member (e.g., the conductive member 412 of FIG. 4A) that is connected thereto through a connecting part (e.g., the connecting part 411 of FIG. 4A). According to an embodiment, the conductive sidewall 410 and the conductive member 412 may be integrally formed with each other through the connecting part 411.

In operation 1305, according to various embodiments, a non-conductive member (e.g., the non-conductive member 420 of FIG. 4A) may be disposed to make contact with the conductive member 412. According to an embodiment, the first surface (the first surface 4121 of FIG. 4A) of the conductive member 412 may be disposed to be exposed through the first surface (e.g., the first surface 4201 of FIG. 4A) of the non-conductive member 420. According to an embodiment, the second surface 4122 that is opposite to the first surface 4121 of the conductive member 412 may be disposed so as to not be exposed through the second surface 4202 that is opposite to the first surface 4201 of the non-conductive member 420. According to an embodiment, the first surface (e.g., 6121 of FIG. 6A) of the conductive member (e.g., the conductive member 612 of FIG. 6A) may also be disposed so as to not be exposed through the first surface (e.g., the first surface of FIG. 6A) of the non-conductive member (e.g., the non-conductive member 620 of FIG. 6A). According to an embodiment, the housing 400 may be manufactured by coupling the non-conductive member 420 made of a synthetic resin to the conductive sidewall 410 through double injection molding. According to an embodiment, the non-conductive member 420 may also be coupled with the conductive sidewall 410 through insert molding. According to an embodiment, the non-conductive member 420 may also be coupled with the conductive sidewall 410 through a structural shape.

In operation 1307, according to various embodiments, a through-hole (e.g., the through-hole 421 of FIG. 4A) may be formed from the non-conductive member 420 to the conductive member 412. According to an embodiment, the through-hole 421 may be formed to extend from the second surface 4502 of the non-conductive member 420 to the second surface 4122 of the conductive member 412. According to an embodiment, the through-hole 421 may be formed in a funnel shape that has a gradually increasing cross-sectional area from the second surface 4122 of the conductive member 412 toward the second surface 4202 of the non-conductive member 420. According to an embodiment, the conductive member 412 may have a bore (e.g., the bore 413 of FIG. 4A) that is formed therein lengthwise for receiving a conductive structure (the conductive structure 440 of FIG. 4A) and communicates with the through-hole 421. However, without being limited thereto, the bore 413 of the conductive member 412 may be formed by forming the bore 413 first when forming the conductive sidewall 410, coupling the non-conductive member 420 to the conductive sidewall 410, and then removing the non-conductive member 420 filling the bore 413.

In operation 1309, according to various embodiments, the conductive structure 440 may be disposed in the through-hole 421. According to an embodiment, the conductive structure 440 may be disposed in such a manner that the through-hole 421 and the bore 413 are filled or coated with the conductive structure. According to an embodiment, a conductive epoxy resin with viscosity, a conductive ink, a polymer, a conductive material dispersed in the polymer, or the like may be used as the conductive structure 440. According to an embodiment, the conductive epoxy resin may be obtained by mixing conductive particles or powder with a viscous thermoplastic resin so as to make a non-conductive epoxy resin conductive.

In operation 1311, according to various embodiments, the conductive pattern 430 may be disposed in at least one area that includes the area where the conductive structure 440 is disposed on the second surface 4202 of the non-conductive member 420. According to an embodiment, although the conductive pattern 430 is used as an antenna radiator while being electrically connected with the conductive sidewall 410 through the conductive member 412, the conductive pattern 430 may be used as an independent antenna radiator when the conductive member 412 is separated and insulated from the conductive sidewall 410 (for example, in the case of a metal island). However, without being limited thereto, the conductive sidewall 410 and the conductive pattern 430 may perform a coupling operation to serve as a parasitic antenna radiator for each other even though the conductive member 412 is separated and insulated from the conductive sidewall 410. According to an embodiment, if the conductive member 412 is formed of a non-conductive material, the conductive member may be electrically insulated from the conductive sidewall 410, and a crack may be prevented by the conductive sidewall 410.

According to various embodiments, a conductive member (the conductive member 512 of FIG. 5A) and a non-conductive member (e.g., the non-conductive member 520 of FIG. 5A) may be coupled with each other; a through hole (e.g., the through-hole 521 of FIG. 5A) may be formed; a conductive pattern (e.g., the conductive pattern 530 of FIG. 5A) may extend to at least one area of the through-hole 521; and a conductive structure (e.g., the conductive structure 540 of FIG. 5A) may then be applied to the upper portion of the conductive pattern.

According to the various embodiments, the conductive structure may be interposed between the conductive pattern, which is formed on the non-conductive member, and the metal member in the housing formed of heterogeneous materials to prevent a degradation in the performance of the antenna device even though an external impact is applied to the electronic device.

According to various embodiments, an electronic device may include: a first cover configured to form a first surface of the electronic device; a second cover configured to form a second surface of the electronic device, the second cover being opposite to the first surface; a conductive sidewall configured to be disposed around, or to surround at least a part of a space formed between the first cover and the second cover; a conductive member located in the space and configured to integrally extend from the conductive sidewall, the conductive member including a first surface directed toward the first cover and a second surface directed toward the second cover; a non-conductive member disposed in the space to make contact with the conductive member, the non-conductive member including a first surface directed toward the first cover and a second surface directed toward the second cover; a conductive pattern disposed on the second surface of the non-conductive member and electrically connected to the conductive member; and a conductive structure disposed between the conductive pattern and the conductive member to electrically connect the conductive pattern to the conductive member. The non-conductive member may include a via hole that at least partially passes through the area between the first surface and the second surface thereof, and the conductive structure may include a first part having a first cross-sectional area and a second part having a second cross-sectional area that is larger than the first cross-sectional area, wherein at least a part of the conductive structure may be disposed within a through-hole of the non-conductive member, and the second part may be disposed closer to the second surface of the non-conductive member than the first part.

According to various example embodiments, the electronic device may further include a display device located in the space and configured to have a screen area that is exposed through the first cover.

According to various embodiments, the conductive structure may at least partially contain a material that is different from that of the conductive member or conductive pattern.

According to various embodiments, at least a part of the conductive structure may be integrally formed with the conductive member or conductive pattern.

According to various embodiments, the electronic device may further include a printed circuit board (PCB) disposed in the space, and the conductive structure may be disposed between the conductive pattern and the printed circuit board to electrically connect the conductive pattern to the printed circuit board.

According to various embodiments, the electronic device may further include: a printed circuit board (PCB) disposed in the space; and a connecting member electrically connected between the conductive member and the printed circuit board, and the connecting member may make contact with the first surface of the conductive member.

According to various embodiments, the conductive structure may include a conductive epoxy resin with viscosity, a conductive ink, a polymer, or a conductive material dispersed in the polymer.

According to various embodiments, a bore formed in the conductive member may be filled or coated with the conductive structure, and the conductive structure may extend to the second surface of the non-conductive member so as to be exposed through the second surface of the non-conductive member and may make contact with the conductive pattern.

According to various embodiments, the bore formed in the conductive member may be filled or coated with the conductive structure, and the conductive structure may extend to the first surface of the non-conductive member so as to be exposed through the first surface of the non-conductive member.

According to various embodiments, the conductive pattern may extend to at least one area of a through-hole that is formed from the second surface of the non-conductive member to the bore.

According to various embodiments, the through-hole and the bore may be filled or coated with the conductive structure after the extending conductive pattern is disposed on the at least one area of the through-hole.

According to various embodiments, the conductive structure may be disposed between the conductive member and the conductive pattern, or may be disposed on the conductive pattern.

According to various embodiments, the part of the conductive structure that makes contact with the conductive member may be connected in such a manner that a plurality of unit patterns make contact with the conductive member.

According to various embodiments, the conductive structure may be a screw that is fastened to the conductive member and makes physical contact with the conductive pattern.

According to various embodiments, the conductive member and the non-conductive member may be vertically disposed to overlap each other, and a receiving space may be formed through the conductive member and the non-conductive member and may be filled or coated with the conductive structure.

According to various embodiments, the receiving space may have a gradually increasing cross-sectional area toward the conductive pattern.

According to various embodiments, at least a part of the conductive member may be disposed to be exposed to the receiving space when the receiving space is filled or coated with the conductive structure, and the conductive pattern may be brought into contact with the conductive structure, with which the receiving space is filled or coated, and the exposed conductive member.

According to various embodiments, the conductive pattern may include a direct printed antenna (DPA) and a conductive layer that is formed on at least one area of the second surface 4202 of the non-conductive member through a process, such as printing, plating, painting, or the like.

According to various embodiments, a method for manufacturing a housing may include: forming a conductive sidewall that includes a conductive member; coupling a non-conductive member to the conductive sidewall such that at least a part of the conductive member is embedded in the non-conductive member; forming a through-hole from a first surface of the non-conductive member to the conductive member; filling or coating the through-hole with a conductive structure; and forming a conductive pattern on at least a part of the area that contains the through-hole formed in the first surface of the non-conductive member.

According to various embodiments, the method may further include: exposing at least a part of the conductive member through a second surface of the non-conductive member that is opposite to the first surface; and electrically connecting the exposed conductive member with a printed circuit board through a connecting member that makes physical contact with the printed circuit board.

What is claimed is:
1. An electronic device comprising:
 a first cover configured to form a first surface of the electronic device;

a second cover configured to form a second surface of the electronic device, the second cover being opposite to the first surface;

a conductive sidewall configured to surround at least a part of a space formed between the first cover and the second cover;

a conductive member disposed in the space and configured to integrally extend from the conductive sidewall, the conductive member comprising a first surface directed toward the first cover and a second surface directed toward the second cover;

a non-conductive member disposed in the space to make contact with the conductive member, the non-conductive member comprising a first surface directed toward the first cover and a second surface directed toward the second cover;

a conductive pattern disposed on the second surface of the non-conductive member and electrically connected to the conductive member; and a conductive structure disposed between the conductive pattern and the conductive member to electrically connect the conductive pattern to the conductive member, wherein the non-conductive member comprises a via hole that at least partially passes through a portion of the non-conductive member between the first surface and the second surface thereof, and the conductive structure at least partially disposed within a through-hole of the non-conductive member, the conductive structure comprising a first part having a first cross-sectional area and a second part having a second cross-sectional area that is larger than the first cross-sectional area, and the second part is disposed closer to the second surface of the non-conductive member than the first part.

2. The electronic device of claim 1, wherein the electronic device further comprises a display device at least partially disposed in the space and configured to have a screen area that is exposed through the first cover.

3. The electronic device of claim 1, wherein the conductive structure includes a material that is different from that of one or more of the conductive member and conductive pattern.

4. The electronic device of claim 1, wherein at least a part of the conductive structure is integrally formed with one or more of the conductive member and conductive pattern.

5. The electronic device of claim 1, wherein the electronic device further comprises a printed circuit board (PCB) disposed in the space, and the conductive structure is disposed between the conductive pattern and the printed circuit board to electrically connect the conductive pattern to the printed circuit board.

6. The electronic device of claim 1, further comprising:
a printed circuit board (PCB) disposed in the space; and
a connecting member electrically connected between the conductive member and the printed circuit board,
wherein the connecting member makes contact with the first surface of the conductive member.

7. The electronic device of claim 1, wherein the conductive structure comprises one or more of a conductive epoxy resin with viscosity, a conductive ink, a polymer, and a conductive material dispersed in the polymer.

8. The electronic device of claim 1, wherein a bore formed in the conductive member is filled or coated with the conductive structure, and the conductive structure extends to the second surface of the non-conductive member so as to be exposed through the second surface of the non-conductive member and makes contact with the conductive pattern.

9. The electronic device of claim 8, wherein the bore formed in the conductive member is filled or coated with the conductive structure, and the conductive structure extends to the first surface of the non-conductive member so as to be exposed through the first surface of the non-conductive member.

10. The electronic device of claim 8, wherein the conductive pattern extends to at least one area of a through-hole that is formed to extend from the second surface of the non-conductive member to the bore.

11. The electronic device of claim 10, wherein the through-hole and the bore are filled or coated with the conductive structure after the extending conductive pattern is disposed on the at least one area of the through-hole.

12. The electronic device of claim 1, wherein the conductive structure is disposed between the conductive member and the conductive pattern, or is disposed on the conductive pattern.

13. The electronic device of claim 12, wherein a part of the conductive structure that makes contact with the conductive member is connected such that a plurality of unit patterns make contact with the conductive member.

14. The electronic device of claim 1, wherein the conductive structure comprises a screw that is fastened to the conductive member and makes physical contact with the conductive pattern.

15. The electronic device of claim 1, wherein the conductive member and the non-conductive member are vertically disposed to overlap each other, and a receiving space is formed through the conductive member and the non-conductive member, and the receiving space is filled or coated with the conductive structure.

16. The electronic device of claim 15, wherein the receiving space has a gradually increasing cross-sectional area in a direction from the conductive member toward the conductive pattern.

17. The electronic device of claim 15, wherein at least a part of the conductive member is disposed to be exposed to the receiving space when the receiving space is filled or coated with the conductive structure, and the conductive pattern is brought into contact with the conductive structure, and the exposed conductive member.

18. The electronic device of claim 1, wherein the conductive pattern comprises a direct printed antenna (DPA) and a conductive layer formed on at least one area of the second surface of the non-conductive member by at least one of printing, plating and painting.

19. A method for manufacturing a housing, comprising:
forming a conductive sidewall that comprises a conductive member;
coupling a non-conductive member to the conductive sidewall such that at least a part of the conductive member is embedded in the non-conductive member;
forming a through-hole from a first surface of the non-conductive member to the conductive member;
filling or coating the through-hole with a conductive structure; and
forming a conductive pattern on at least a part of the area that contains the through-hole formed in the first surface of the non-conductive member.

20. The method of claim 19, further comprising:
exposing at least a part of the conductive member through a second surface of the non-conductive member that is opposite to the first surface; and electrically connecting the exposed conductive member with a printed circuit board through a connecting member that makes physical contact with the printed circuit board.

* * * * *